(12) United States Patent
Socha

(10) Patent No.: US 8,340,394 B2
(45) Date of Patent: Dec. 25, 2012

(54) METHOD, PROGRAM PRODUCT AND APPARATUS FOR PERFORMING A MODEL BASED COLORING PROCESS FOR GEOMETRY DECOMPOSITION FOR USE IN A MULTIPLE EXPOSURE PROCESS

(75) Inventor: Robert John Socha, Campbell, CA (US)

(73) Assignee: ASML Netherlands B.V., Veldhoven (NL)

( * ) Notice: Subject to any disclaimer, the term of this patent is extended or adjusted under 35 U.S.C. 154(b) by 540 days.

(21) Appl. No.: 12/509,389

(22) Filed: Jul. 24, 2009

(65) Prior Publication Data
US 2010/0021055 A1    Jan. 28, 2010

Related U.S. Application Data

(60) Provisional application No. 61/129,890, filed on Jul. 28, 2008.

(51) Int. Cl.
*G06K 9/00* (2006.01)

(52) U.S. Cl. .......................................... 382/145; 716/51

(58) Field of Classification Search .................. 382/145; 716/52, 53, 54
See application file for complete search history.

(56) References Cited

U.S. PATENT DOCUMENTS

| | | | |
|---|---|---|---|
| 5,969,441 A | 10/1999 | Loopstra et al. | |
| 6,046,792 A | 4/2000 | Van Der Werf et al. | |
| 7,043,712 B2 * | 5/2006 | Mukherjee et al. | 716/52 |
| 7,493,589 B2 * | 2/2009 | Socha | 716/50 |
| 2007/0157154 A1 * | 7/2007 | Socha | 716/21 |

* cited by examiner

*Primary Examiner* — Roy M Punnoose
(74) *Attorney, Agent, or Firm* — Pillsbury Winthrop Shaw Pittman LLP

(57) ABSTRACT

A method of decomposing a target pattern having features to be imaged on a substrate so as to allow said features to be imaged in a multi-exposure process. The method includes the steps of: (a) dividing a plurality of the features into a plurality of segments; (b) determining the image log slope (ILS) value for each of the plurality of segments; (c) determining the value of the gradient of the image log slope (ILS) value for each of the plurality of segments; and (d) assigning a phase or color to the segments based on the values of the gradient of the image log slope of each of the plurality of segments.

20 Claims, 22 Drawing Sheets

METHOD, PROGRAM PRODUCT AND APPARATUS FOR PERFORMING A MODEL BASED COLORING PROCESS FOR GEOMETRY DECOMPOSITION FOR USE IN A MULTIPLE EXPOSURE PROCESS

CROSS-REFERENCE TO RELATED APPLICATIONS

The present Application claims priority from U.S. Provisional Patent Application No. 61/129,890 filed Jul. 28, 2008 which application is expressly incorporated by reference herein in its entirety.

TECHNICAL FIELD

The technical field of the present invention relates generally to a method, program product and apparatus for performing a model based coloring process for decomposition of a target pattern so as to allow the target pattern to be imaged utilizing, for example, multiple masks in a multiple illumination process.

BACKGROUND OF THE INVENTION

Lithographic apparatus can be used, for example, in the manufacture of integrated circuits (ICs). In such a case, the mask may contain a circuit pattern corresponding to an individual layer of the IC, and this pattern can be imaged onto a target portion (e.g., comprising one or more dies) on a substrate (silicon wafer) that has been coated with a layer of radiation-sensitive material (resist). In general, a single wafer will contain a whole network of adjacent target portions that are successively irradiated via the projection system, one at a time. In one type of lithographic projection apparatus, each target portion is irradiated by exposing the entire mask pattern onto the target portion in one go; such an apparatus is commonly referred to as a wafer stepper. In an alternative apparatus, commonly referred to as a step-and-scan apparatus, each target portion is irradiated by progressively scanning the mask pattern under the projection beam in a given reference direction (the "scanning" direction) while synchronously scanning the substrate table parallel or anti-parallel to this direction. Since, in general, the projection system will have a magnification factor M (generally <1), the speed V at which the substrate table is scanned will be a factor M times that at which the mask table is scanned. More information with regard to lithographic devices as described herein can be gleaned, for example, from U.S. Pat. No. 6,046,792, incorporated herein by reference.

In a manufacturing process using a lithographic projection apparatus, a mask pattern is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g., an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc.

For the sake of simplicity, the projection system may hereinafter be referred to as the "lens;" however, this term should be broadly interpreted as encompassing various types of projection systems, including refractive optics, reflective optics, and catadioptric systems, for example. The radiation system may also include components operating according to any of these design types for directing, shaping or controlling the projection beam of radiation, and such components may also be referred to below, collectively or singularly, as a "lens." Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Twin stage lithographic apparatus are described, for example, in U.S. Pat. No. 5,969,441, incorporated herein by reference.

The photolithographic masks referred to above comprise geometric patterns corresponding to the circuit components to be integrated onto a silicon wafer. The patterns used to create such masks are generated utilizing CAD (computer-aided design) programs, this process often being referred to as EDA (electronic design automation). Most CAD programs follow a set of predetermined design rules in order to create functional masks. These rules are set by processing and design limitations. For example, design rules define the space tolerance between circuit devices (such as gates, capacitors, etc.) or interconnect lines, so as to ensure that the circuit devices or lines do not interact with one another in an undesirable way. The design rule limitations are typically referred to as "critical dimensions" (CD). A critical dimension of a circuit can be defined as the smallest width of a line or hole or the smallest space between two lines or two holes. Thus, the CD determines the overall size and density of the designed circuit.

Of course, one of the goals in integrated circuit fabrication is to faithfully reproduce the original circuit design on the wafer (via the mask). As the critical dimensions of the target patterns become increasingly smaller, it is becoming increasingly harder to reproduce the target patterns on the wafer. However, there are known techniques that allow for a reduction in the minimum CD that can be imaged or reproduced in a wafer. One such technique is the double exposure technique wherein features in the target pattern are imaged in two separate exposures.

For example, one commonly known double exposure technique is dipole illumination. In this technique, during a first exposure the vertical edges of the target pattern (i.e., features) are illuminated and then during a second exposure the horizontal edges of the target pattern are illuminated. As noted, by utilizing two exposures, improved imaging performance may be obtained.

Another known double exposure technique allows the features of a given target pattern to be separated into two different masks and then imaged separately to form the desired pattern. Such a technique is typically utilized when the target features are spaced so closely together that it is not possible to image the individual features. In such a situation, as noted, the target features are separated into two masks such that all the features on a given mask are spaced sufficiently apart from one another so that each feature may be individually imaged. Then, by imaging both masks in a sequential manner (with the appropriate shielding), it is possible to obtain the target pattern having the densely spaced features that could not be properly imaged utilizing a single mask.

Thus, by separating the target features into two separate masks, such that the pitch between each of the features on a given mask is above the resolution capabilities of the imaging system, it is possible to improve imaging performance. Indeed, the above-mentioned double exposure techniques allow for a $k_1$<0.25. However, problems and limitations still exist with currently known double exposure techniques.

For example, current decomposition algorithms typically treat each piece of geometry (i.e., feature) in the target design/pattern as one unit, and none of these units are automatically decomposed into multiple segments. As a result, for certain target patterns, even though double exposure techniques are utilized, it is not possible to obtain a $k_1$<0.25.

Another problem associated with current decomposition algorithms is that they are primarily rule based algorithms, which require an excessive number of rules to handle today's increasingly complex designs. Moreover, often times there are situations/conflicts within the design for which no rule has been defined, and such instances can result in the algorithm failing to find a suitable result.

It is an object of the present invention to overcome such deficiencies in known double exposure techniques.

SUMMARY OF THE INVENTION

In view of the foregoing, it is an object of the present invention to overcome the deficiencies of known prior art techniques by providing a model based process for decomposing (i.e., coloring) the features of a target pattern into distinct segments which are imaged separately, for example, by utilizing multiple masks.

In summary, the present invention provides a model based coloring process that allows for decomposition of the target pattern into multiple reticles which are illuminated utilizing multiple exposures. The model based coloring process, when necessary, automatically provides for decomposition of geometries (including single geometries) of the target pattern into multiple segments, which can be imaged in separate masks using double (or multiple) exposures. The total image is the union of all the exposures (i.e., the original target design is created by stitching together the images created by multiple exposures).

More specifically, the present invention relates to a method of decomposing a target pattern having features to be imaged on a substrate so as to allow the features to be imaged in a multi-exposure process. The method includes the steps of: (a) dividing a plurality of the features into a plurality of segments; (b) determining the image log slope (ILS) value for each of the plurality of segments; (c) determining the value of the gradient of the image log slope (ILS) value for each of the plurality of segments; and (d) assigning a phase or color to the segments based on the values of the gradient of the image log slope of each of the plurality of segments.

The present invention provides important advantages over the prior art. Most importantly, the present invention provides a model based coloring process for decomposing the features of a target pattern into distinct segments which can be imaged separately, for example, by utilizing multiple masks. In addition, the model based coloring process of the present invention provides an efficient process for decomposing the target pattern.

It is noted that the coloring problem involves solving an integer programming problem. In integer programming, the solution can have only integers. For double patterning there are two integers. Either the exposure is on mask 1 or mask 2. For triple patterning there are three integers, and the exposure is either on mask 1, mask 2 or mask 3. In the present disclosure, the integer programming problem is solved directly.

Additional advantages of the present invention will become apparent to those skilled in the art from the following detailed description of exemplary embodiments of the present invention.

Although specific reference may be made in this text to the use of the invention in the manufacture of ICs, it should be explicitly understood that the invention has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target portion", respectively.

The invention itself, together with further objects and advantages, can be better understood by reference to the following detailed description and the accompanying drawings.

DETAILED DESCRIPTION OF THE INVENTION

As explained in more detail below, the model based coloring process decomposes a target pattern into multiple segments which are illuminated separately in a multiple exposure process. In one embodiment, the multiple segments are assigned and included in one of two separate reticles, which are subsequently illuminated. Furthermore, as shown in the examples disclosed herein, the model based coloring process, when necessary, automatically provides for decomposition of single geometry (i.e., feature) in the target pattern into multiple segments, which are then imaged in separate illumination processes.

Figure 1:
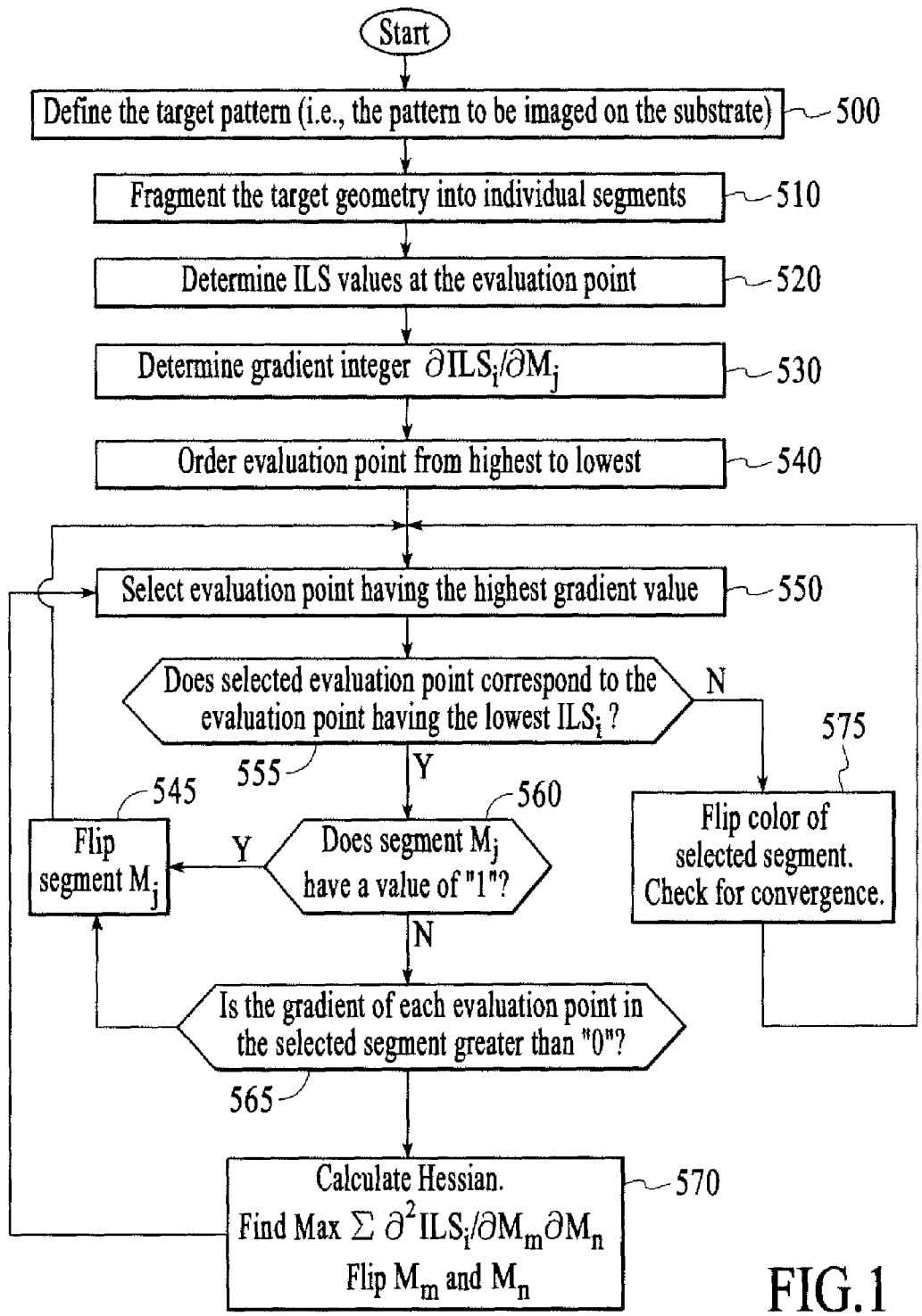
FIG. 1 is an exemplary flowchart illustrating the model based coloring process of the present invention, which is utilized to decompose a target pattern into multiple segments, which are then utilized in a multiple illumination process.

Referring to FIG. 1, which is an exemplary flowchart of the model based coloring process, the first step in the process (Step 500) is to define the target pattern (i.e., the pattern to be imaged on the substrate) and the illumination settings that will be utilized to image the target pattern. The target pattern is preferably described in a data format, such as "gds", which is a standard data format. However, any other suitable data format can also be utilized.

Figure 2:
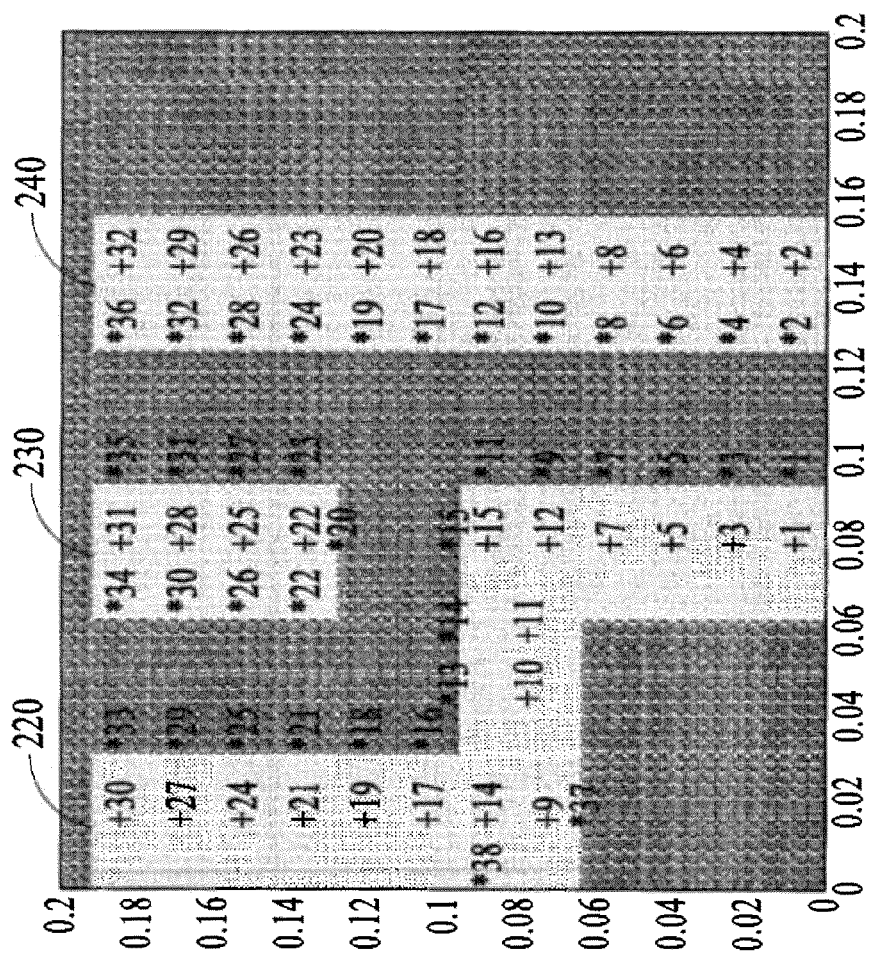
FIG. 2 illustrates an exemplary target pattern that will be decomposed into multiple segments utilizing the coloring process of the present invention.

FIG. 2 illustrates the exemplary target pattern that will be utilized to illustrate the model based coloring process. As shown, the exemplary target pattern includes three features 220, 230 and 240. It is noted that the illumination settings include, for example, but are not limited to, type of illumination (i.e., annular, quadrature, off-axis, etc.), λ (wavelength of source), NA (numerical aperture of projection lens), etc.

The next step in the process (Step 510) is to fragment the target geometry into individual segments or pixels so as to divide the target pattern into a plurality of distinct sections. In the given example, as shown in FIG. 2, each of the target features, 220, 230, 240 is divided into segments of substantially the same size, which are numbered 1 to 32 in FIG. 2. It is noted, however, that the segments may be divided such that the segments have different sizes. In one example, the fragmentation is based on examining the minimum space or line that can be resolved in a single exposure (which is referred to herein as "A" where A=k1*λ/NA, and where k1 is typically greater than 0.3). A ray is then projected for each vertex of the geometry in which the ray has a length equal to the minimum resolvable space, A. If the ray intersects geometry, a fragmentation point is placed there. The ray continues its projection until no other geometry is intersected. Another fragmentation technique is to simply pixelize the mask in which the pixel size is determined by the resolution of the mask writer. Of course, other schemes for segmenting the target pattern may also be utilized.

The next step in the process (Step 520) is to place evaluation points within the target pattern and to determine the image log slope (ILS) at the ILS evaluation points. For example, in one embodiment, it is possible to place a single ILS evaluation point in each segment (which are numbered 1 to 32 in FIG. 2). In another embodiment, the ILS evaluation points can be placed within the target pattern based on the operator's expectation regarding features (or portions of features) that are expected to be problematic with respect to imaging (i.e., not expected to image properly, or to be difficult to image), or by a rule based technique, such as placing the evaluation points in any segment have a width which is less than 0.3λ/NA, where λ is the wavelength of source, and NA is the numerical aperture of the projection lens of the illumination system. In another embodiment, evaluation points are placed at edges of a given segment which have an opposing edge of another segment adjacent thereto and within a predefined distance, and at locations commonly known as being difficult to print (e.g., corner features). Of course, other methods for placing ILS evaluation points are also possible.

It is noted that each fragment needs at least one ILS evaluation point. The ILS evaluation points may be placed by calculating the normal of the geometry at the ILS evaluation point. For one fragment, it is preferable to not have ILS evaluation points with the same normal value. Also the fragment should have an ILS evaluation point for each unique normal for the fragment. ILS evaluation points are only placed on sides of fragments which are not shared with another fragment. For example, a contact hole that cannot be divided up into multiple fragments requires four ILS evaluation points because the contact hole has for sides with each side having a unique normal. Likewise in a line divided up into the three fragments, the center fragment has two ILS evaluation points because it has two sides which are not shared with another fragment. Likewise, each of the two fragments that form the line ends require three ILS evaluation points because these fragments have three sides which are not shared by another fragment.

As such, in accordance with the foregoing process, each of the features 220, 230 and 240 of the target pattern are represented by a plurality of smaller segments (denoted Mj, where j=1 to n, with n defining the total number of segments). In the given example, as shown in FIG. 2, there are a total of 32 segments. It is noted that adjacent segments may share a common edge. Initially, each of the segments is assigned the same designation associated with the mask the segment is assigned to. For example, each segment can be assigned a phase of 0°, where the phase (e.g., 0° or 180°) assigned to a given segment will be utilized to indicate whether the given segment, Mj, will be assigned to a first mask (and imaged in a first exposure) or assigned to a second mask (and imaged in a second exposure). It is also noted that assigning a phase is merely one technique for designating which exposure a given segment will be assigned to. For example, it is also possible to assign a color designation to each of the given segments, where the color designation indicates which exposure the segment is assigned. Of course, any other suitable designation system may also be utilized.

Figure 3:
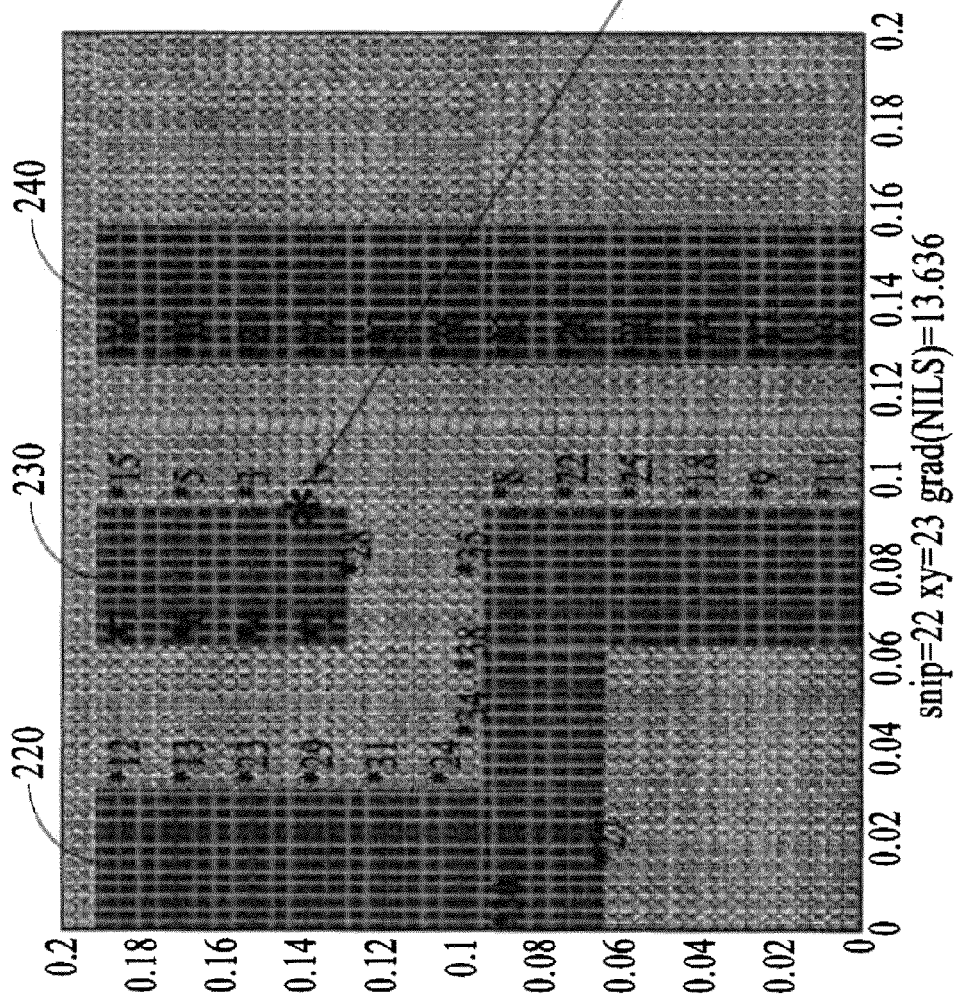
FIGS. 3-20 illustrate an example of the application of the decomposition process on the exemplary target pattern illustrated in FIG. 2.

Continuing, as noted, in Step 520 the image log slope (ILS) is calculated for each evaluation point for each segment utilizing the illumination settings defined in Step 510. As noted above, each segment may have more than one evaluation point, hereinafter referenced by variable "i". As is known, the ILS can be calculated utilizing various known methods, such as, but not limited to, the method disclosed in U.S. Pat. No. 7,493,589, the contents of which are incorporated herein by reference. For example, the ILS can be calculated by the equation ILS=ñg∇[ln(I)]. Referring to FIGS. 2 and 3, the numbers adjacent each of the segments having a "*" adjacent thereto represent the exemplary ILS numbers associated with the evaluation points of the given example.

Next, in Step 530, the gradient, ∂ILSi/∂Mj, of the ILSi of each evaluation point is calculated, with respect to changing color of the fragment, Mj. In other words, the gradient at each point indicates the direction of the color change within the fragment. M is an integer and indicates whether the fragment is placed on mask 1 or mask 2. More specifically, the variable M for double patterning can only take on two values (it's an integer hence this is an integer programming technique). M is either on mask one (M=0) or mask two (M=1). When M is on mask one, the gradient of the ILS is calculated by changing M to mask two, and calculating the ILS. Therefore ILS-ILS (M=1)-ILS(M=0). It is noted that in the process described herein, the mask colors are flipped through an integer programming optimization. The mask colors are flipped until minimum ILS at all the ILS evaluation points reaches a global maximum.

Once the ILSi and gradient, ∂ILSi/∂Mj, is calculated for each evaluation point, the next step in the process (Step 540) is to order the gradients of each evaluation point from highest to lowest, and order the ILSi value of each evaluation point from lowest to highest. Thereafter, the following process is repeated until all of the evaluation points have been considered, and the result of the process is an indication of how each mask fragment/segment should be colored.

First (Step 550), the evaluation point having the highest gradient is selected. Next (Step 555), it is determined if the selected evaluation point corresponds to the evaluation point having the lowest ILSi. If so, in Step 560 it is determined if the segment, Mj, corresponding to the given evaluation point has a length of "1" (i.e., meaning a single segment based on the original fragmentation process). If so, then the color of the given segment, Mj, is flipped (Step 545), and the process proceeds back to Step 550 and selects the next evaluation point with the next highest gradient value. It is noted that once any segment is flipped and the process returns to select the next highest ranked evaluation point, the process also recalculates the ILS and gradient values for each evaluation point before selecting the next evaluation point.

If the length of the segment is not "1", the process proceeds to Step 565 and determines if the value of the gradient of each evaluation point associated with the selected segment, Mj, is greater than zero. If so, the color of the given segment, Mj, is flipped (Step 145), and the process proceeds back to Step 550 and selects the next evaluation point with the next highest gradient value.

Alternatively, if the value of the gradient of each evaluation point associated with the selected segment, Mj, is not greater than zero, the process proceeds to Step 570 to calculate the Hessian for all evaluation points of the given segment/fragment, Mj, so as to determine the maximum $\Sigma\partial^2 ILSi/\partial Mm\partial Mn$, and then the color of the segments Mm and Mn are flipped. It is noted that if all the gradients are positive of the ILS points which occupy a possible fragment to flip, the flipping of the that fragment will cause the ILS to increase if the fragment is flipped, which is desirable. However, if one of the gradients are negative, it means flipping one of the fragments will cause one of the ILS points to decrease after the flip. This may be desirable, but to determine if it is desirable, the Hessian is calculated. The Hessian is the second derivative of a vector field. Thereafter, the process proceeds back to Step 550 and this process is performed again until all evaluation points have been processed.

It is noted that the variables m and n represent the fragment number. It's the same as j when calculating the gradient. But since the Hessian is a second derivative, two fragments, m and n, need to be flipped to calculate the Hessian. The ILS points are only summed over the ILS points with the highest gradient.

Returning to FIG. 1 and Step 555, if the currently selected evaluation point based on the highest gradient value, does not correspond to the evaluation point having the lowest ILSi (i.e., there are not both associated with the same segment or fragment, Mj), then the process proceeds to Step 575 in which the color of the segment associated with the selected evaluation point is flipped, and a check for convergence is performed. It is noted that convergence occurs when $\partial ILSi/\partial Mj$ for all i∈j<0. Convergence is tested when flipping the color of any fragment causes the ILS at least one ILS evaluation point to decrease. Convergence may be determined when $\partial ILSi/\partial Mj$ for all i∈j<0 which means that flipping one fragment will cause the ILS to decrease at all the ILS evaluation points. The test for convergence is restricted to $\partial ILSi/\partial Mj$ for all i∈j. This is an important distinction. i∈j means only the ILS evaluation points, i, in which the ILS evaluation point occupies fragment, j. So the process tests for convergence for ILS evaluation points in which flipping the fragment the ILS evaluation point occupies. This restriction is used to prevent a race condition which was common in the IML coloring process. After completing Step 575, the process proceeds back to Step 550 and selects the next evaluation point, and the process is then repeated until all evaluation points have been processed.

FIGS. 3-20 illustrate an example of the application of the process detailed above on the exemplary target pattern illustrated in FIG. 2. Referring to FIG. 3, as noted in Steps 520 and 530, the ILS values and gradient $\partial ILSi/\partial Mj$ values are computed for all evaluation points. The ILS values associated with the evaluation points are illustrated in FIG. 3. The numbers in FIG. 3 are the ranking of the ILS points with point i=1 having the lowest ILS. The gradient values and ILSi values are then ordered from highest to lowest.

Figure 4:
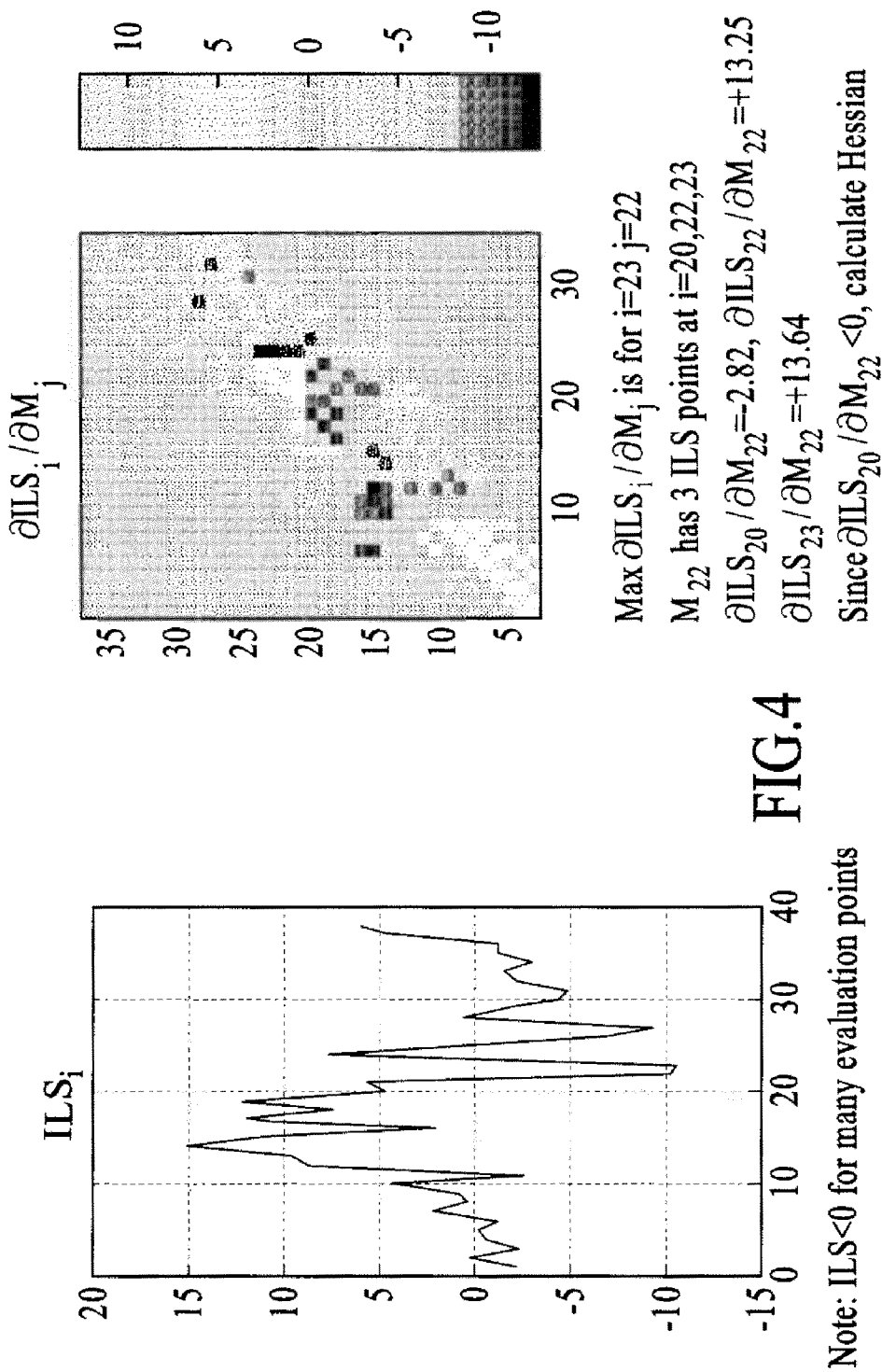
Figure 5:
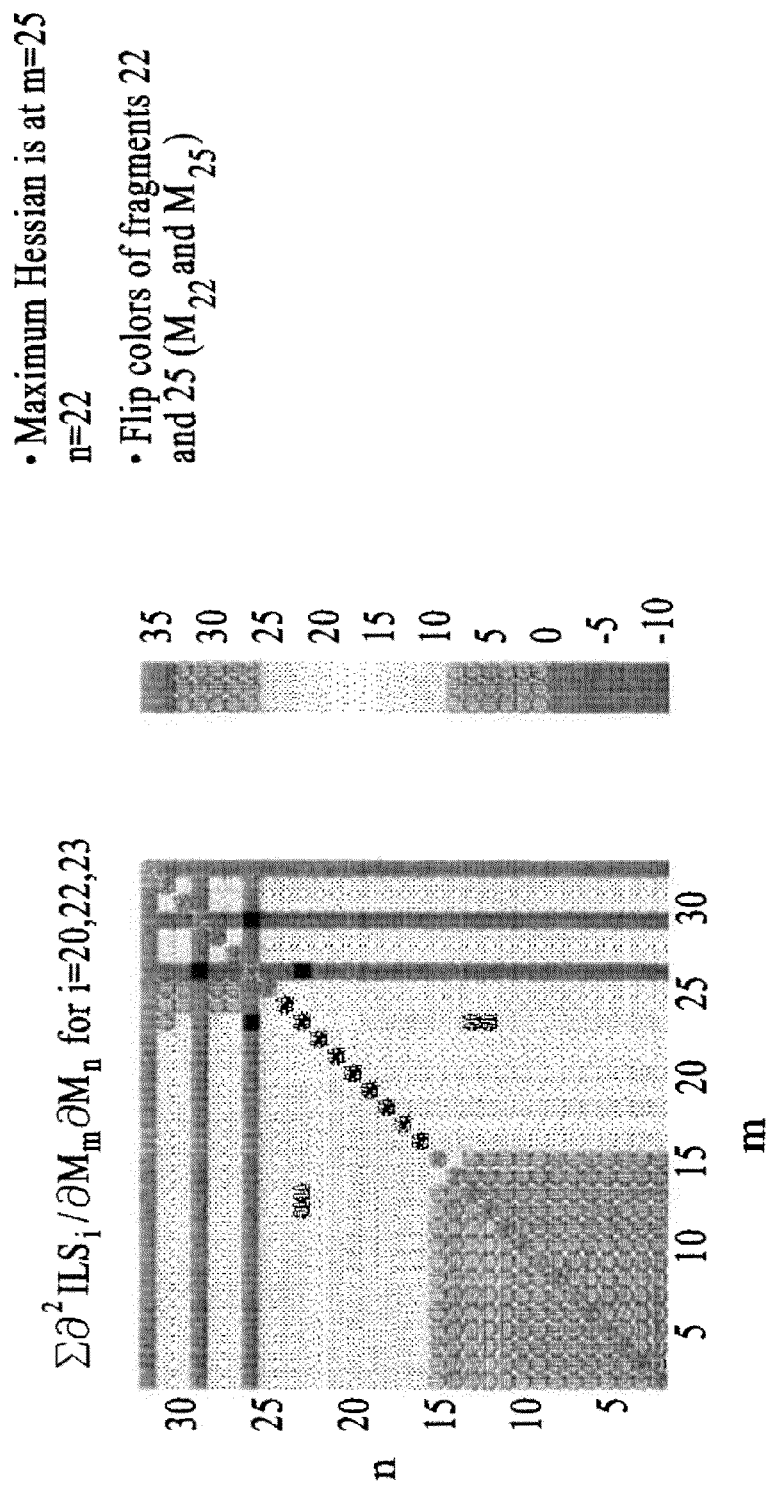

Next, the evaluation point with the highest value gradient is selected. Referring to FIG. 3, this evaluation point corresponds to an evaluation point associated with segment $M_{22}$. Next, it is determined whether or not this evaluation point also corresponds the evaluation point having the lowest ILS value (Step 555), which in the given example, it does. Thus, the process proceeds to Step 560 to determine if the value of the segment M22 is "1" or "0". In this example, the value of the segment, M22 does not equal "1", and therefore the process proceeds to Step 565 to determine if all of the gradient values of evaluation points associated with the selected segment, M22, are greater than "0". As shown in FIGS. 2-4, there are three evaluation points, i, associated with segment M22, which are i=20, 22 and 23. The gradient values associated with each of the evaluation points are: $\partial ILS20/\partial M22=-2.82$; $\partial ILS22/\partial M22=+13.25$; and $\partial ILS23/\partial M22=+13.64$. As all of these gradient values are not greater than "0", the process proceeds to Step 570 and calculates the Hessian so as to identify the maximum $\Sigma\partial^2 ILSi/\partial Mm\partial Mn$. In the given example and shown in FIG. 5, the maximum Hessian occurs at segments m=25 and n=22. Thus, segments M22 and M25 are flipped in color from the original coloring scheme. Thus, at the end of the first iteration of the process, segments M22 and M25, are flipped in color (i.e., assigned to a separate mask for imaging). The process then returns to Step 550 to begin the second iteration of the process. It is again noted that the Hessian is a second derivative (flip the colors of two fragments where the gradient the color of only one fragment is flipped), and the Hessian is used to determine the change in ILS for flipping two colors. The Hessian is necessary for double exposure to prevent flipping fragments back and forth. For a triple exposure a third derivative needs to be calculated.

Figure 6:
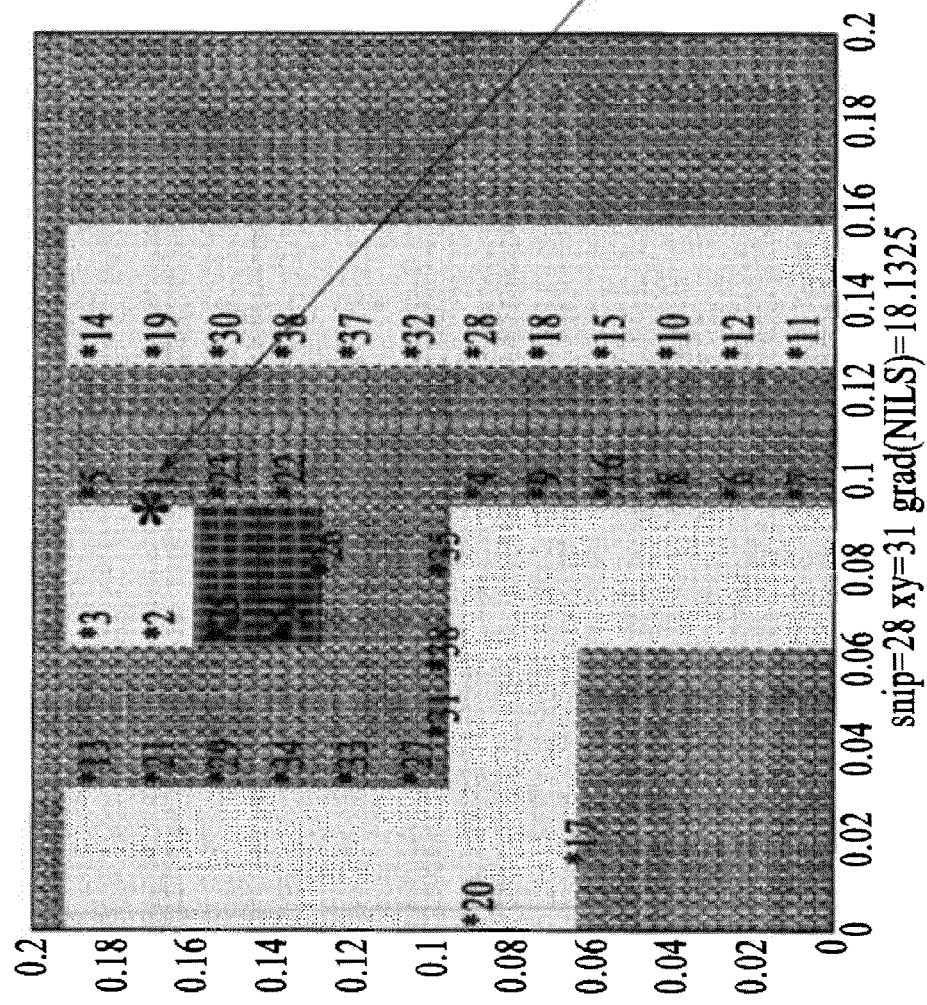
Figure 7:
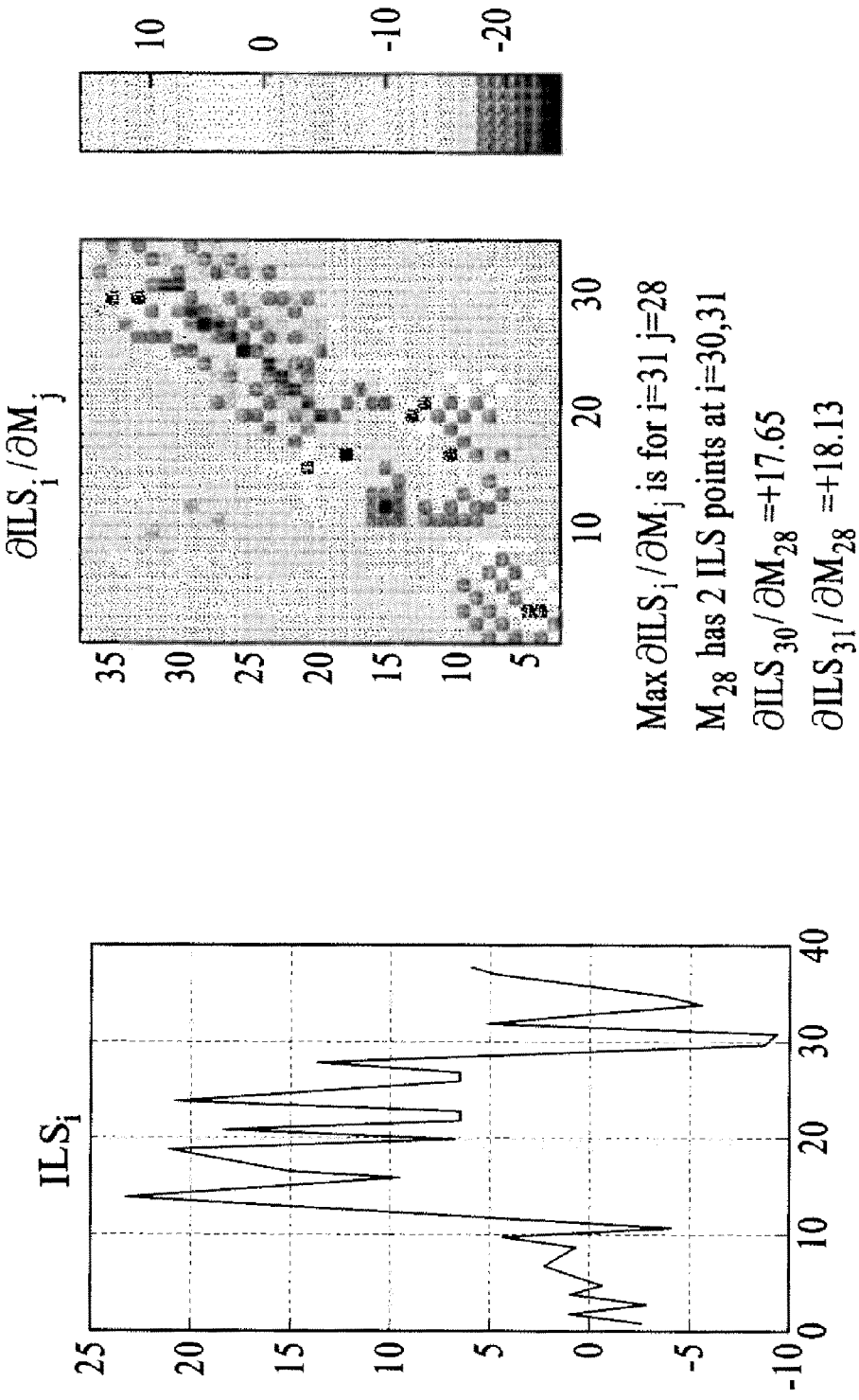

FIGS. 6 and 7 illustrate the second iteration of the process for the given example. It is noted that segments M22 and M25 are shown flipped in color in FIG. 6, which was the result of the first iteration of the process. In the given example, segment, M28 is the segment having the highest gradient value, $\partial ILSi/\partial Mj$, and the same segment, M28, has the lowest ILS value. Further, there are two evaluation points, i=30 and 31, associated with the segment M28. The gradient values associated with each of the evaluation points are: $\partial ILS30/\partial M28+17.65$; and $\partial ILS31/\partial M28+18.13$. As the length of segment M28 is not equal to "1" and all of the gradient values of the evaluation points associated with M28 are greater than "0", the process proceeds to Step 565, where the answer to the condition is YES, so the process then flips the color of segment M28 and returns to Step 550 to begin the next iteration.

Figure 8:
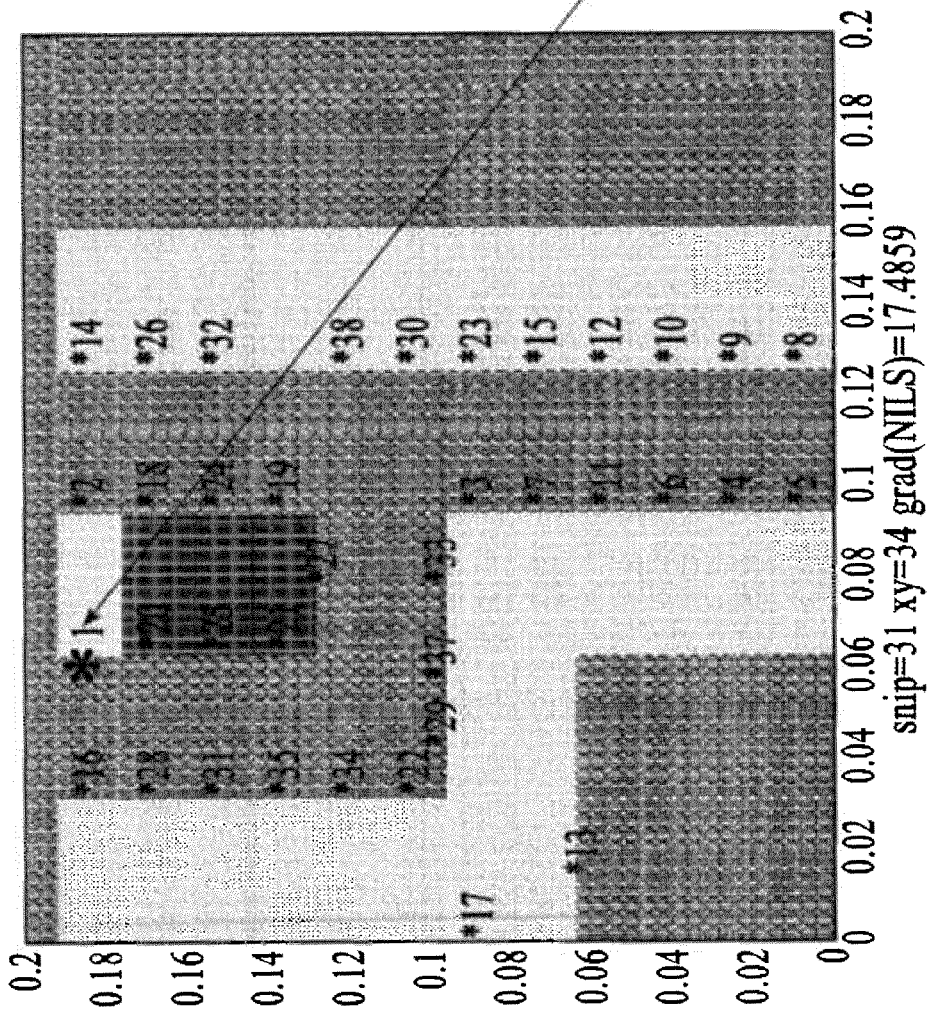

FIG. 8 illustrates the third iteration of the process for the given example. It is noted that segments M28 is also shown as flipped in color in FIG. 8, which was the result of the second iteration of the process. In the given example, segment M31 is the segment having the highest gradient value, $\partial ILSi/\partial Mj$, and the same segment, M31, has the lowest ILS value. Further, there are two evaluation points, i=34 and 35, associated with the segment M31. As the length of segment M31 is equal to "1", the process proceeds to Step 560, where the answer to the condition is YES, so the process then flips the color of segment M31 and returns to Step 550 to begin the next iteration.

Figure 9:
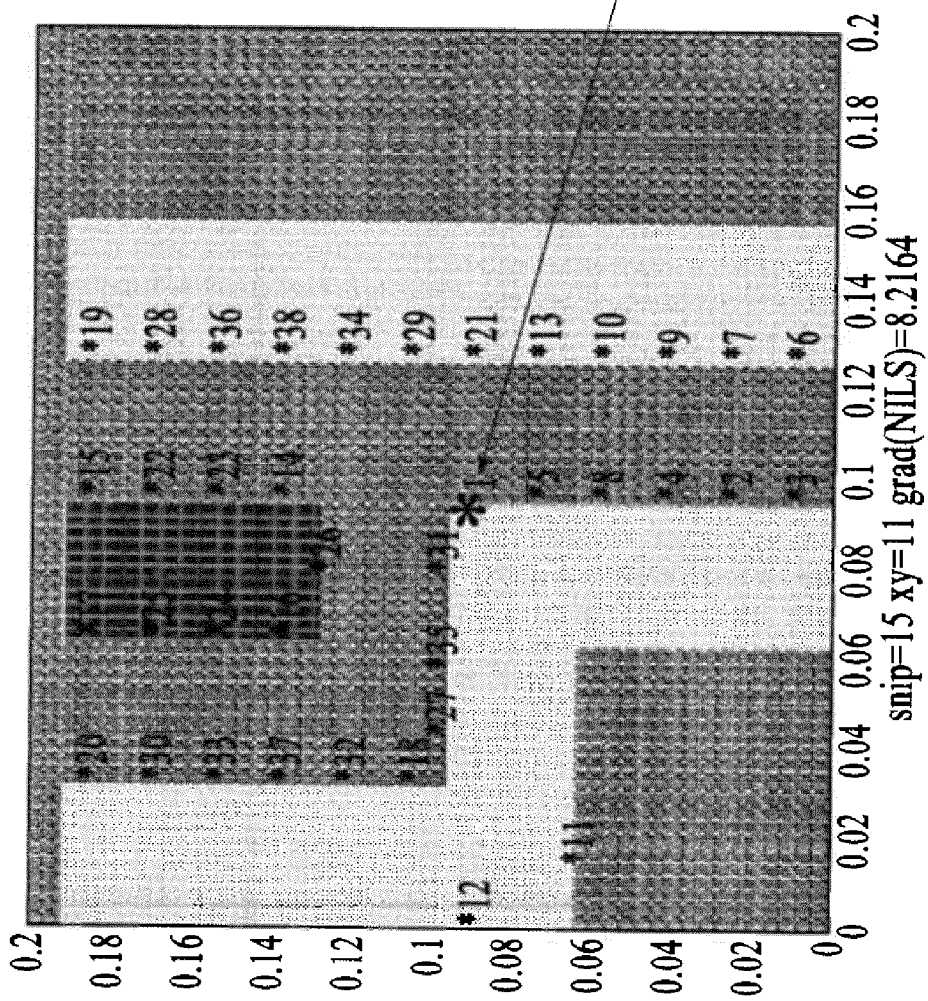
Figure 10:
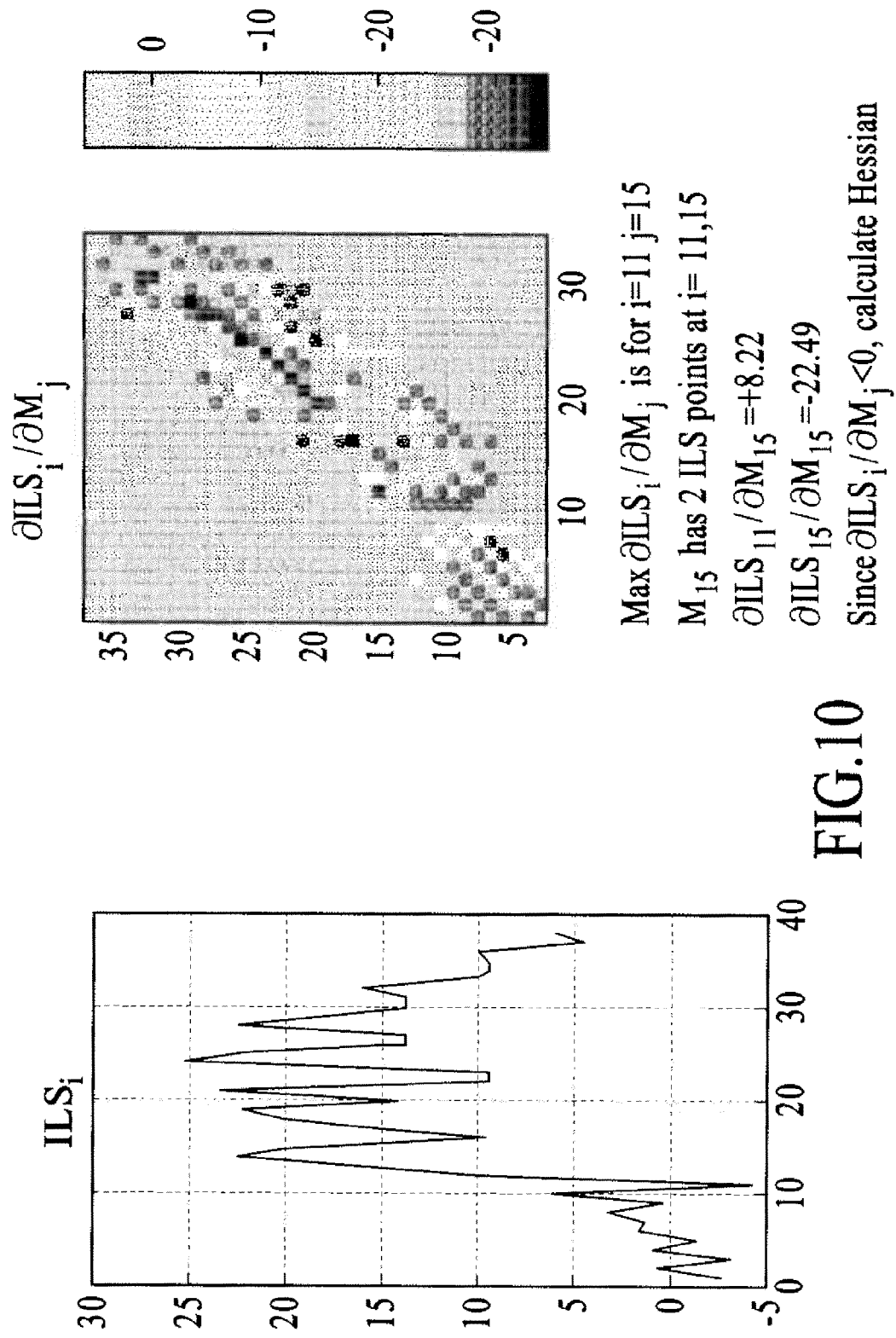
Figure 11:
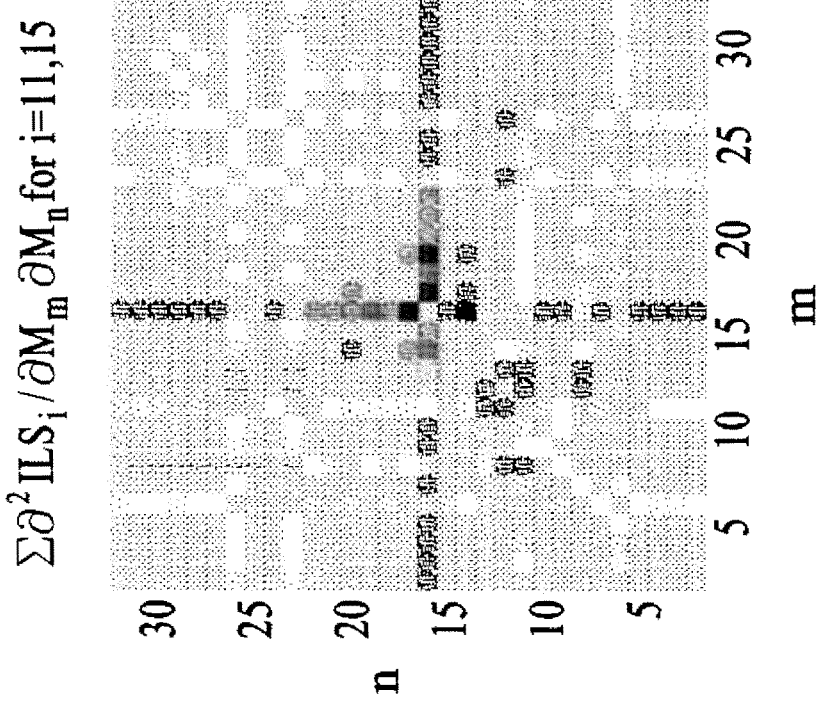

FIGS. 9-11 illustrate the fourth iteration of the process for the given example. It is noted that segment M31 is shown flipped in color in FIG. 9, which was the result of the third iteration of the process. In the given example, segment M15 is the segment having the highest gradient value, $\partial ILSi/\partial Mj$, and the same segment, M15, has the lowest ILS value. Further, there are two evaluation points, i=11 and 15, associated with the segment M15. The gradient values associated with each of the evaluation points are: $\partial ILS11/\partial M15=+8.22$; and $\partial ILS11/\partial M15=-22.49$. As the length of segment M15 is not equal to "1" and all of the gradient values of the evaluation points associated with M28 are not greater than "0", the process proceeds to Step 570, and calculates the Hessian so as to identify the maximum $\Sigma\partial^2 ILSi/\partial Mm\partial Mn$. In the given example and shown in FIG. 11, the maximum Hessian occurs at segments m=16 and n=18. Thus, segments M16 and M18 are flipped in color from the original coloring scheme. Thus, at the end of the fourth iteration of the process of the given example, segments M16 and M18, are flipped in color (i.e., assigned to a separate mask for imaging). The process then returns to Step 550 to begin the fifth iteration of the process.

Figure 12:
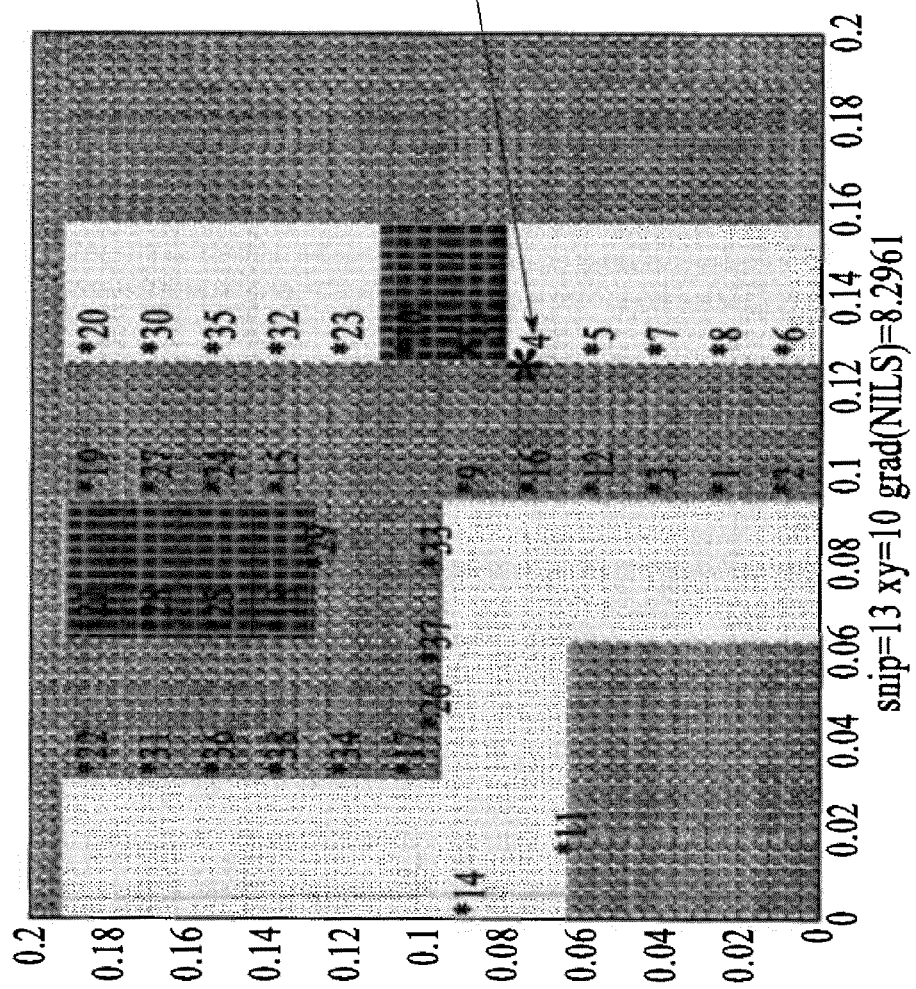
Figure 13:
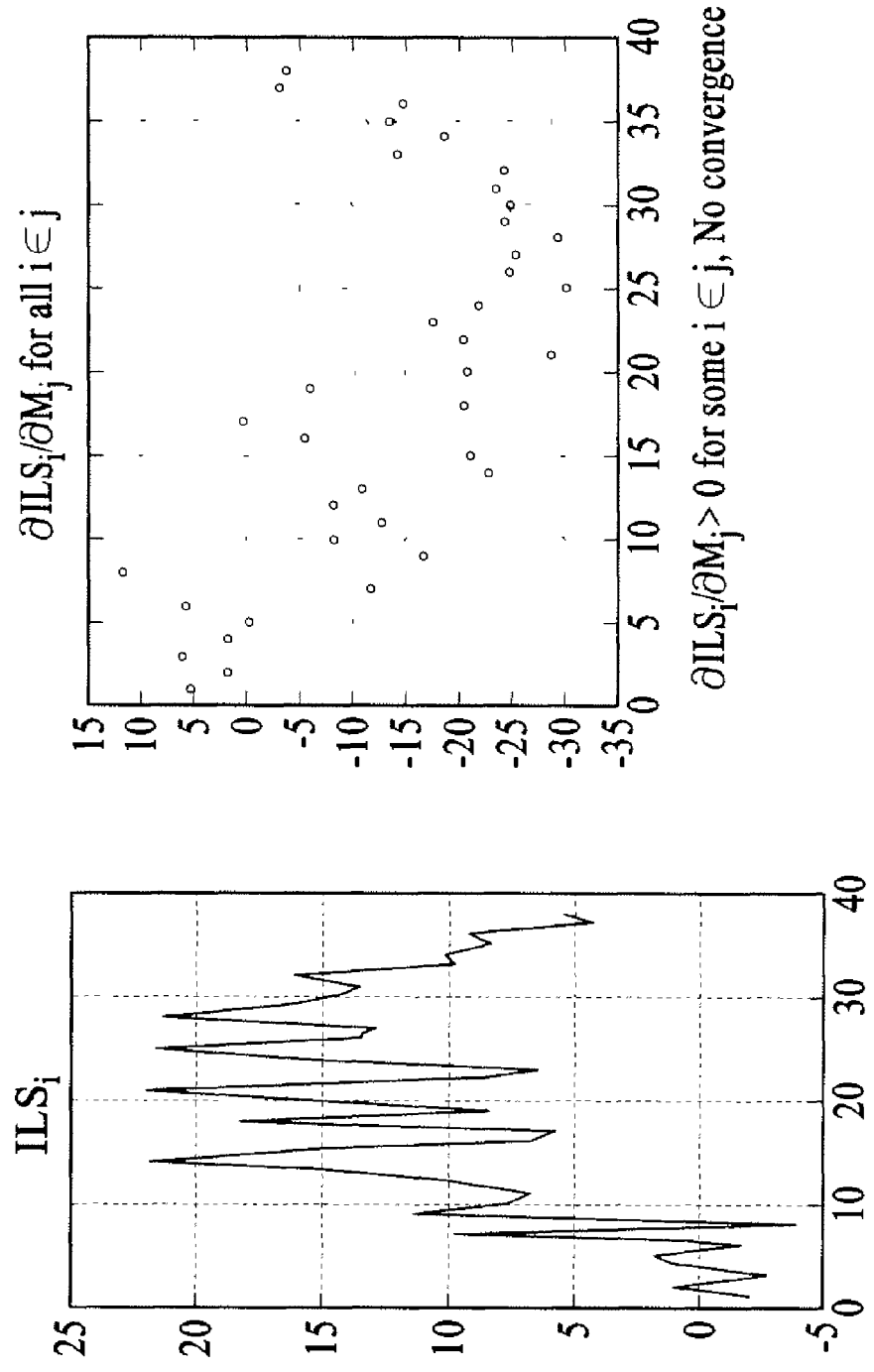
Figure 14:
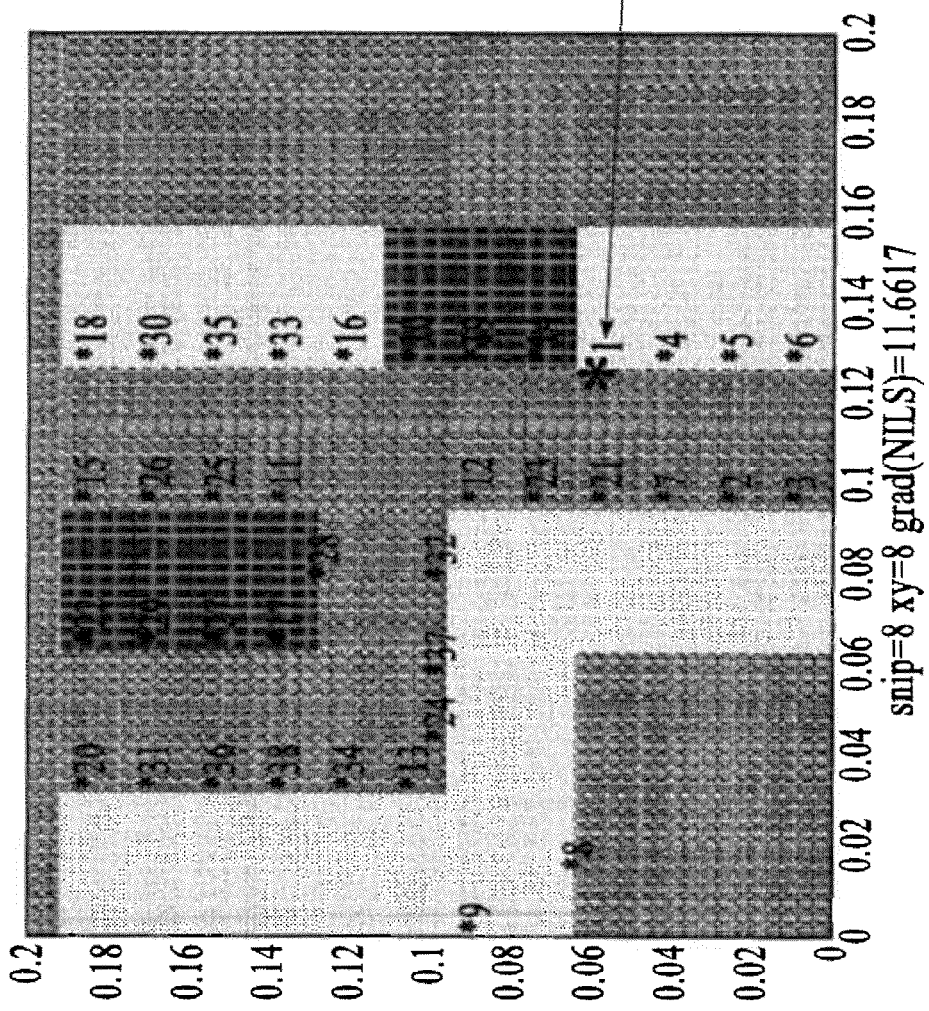
Figure 15:
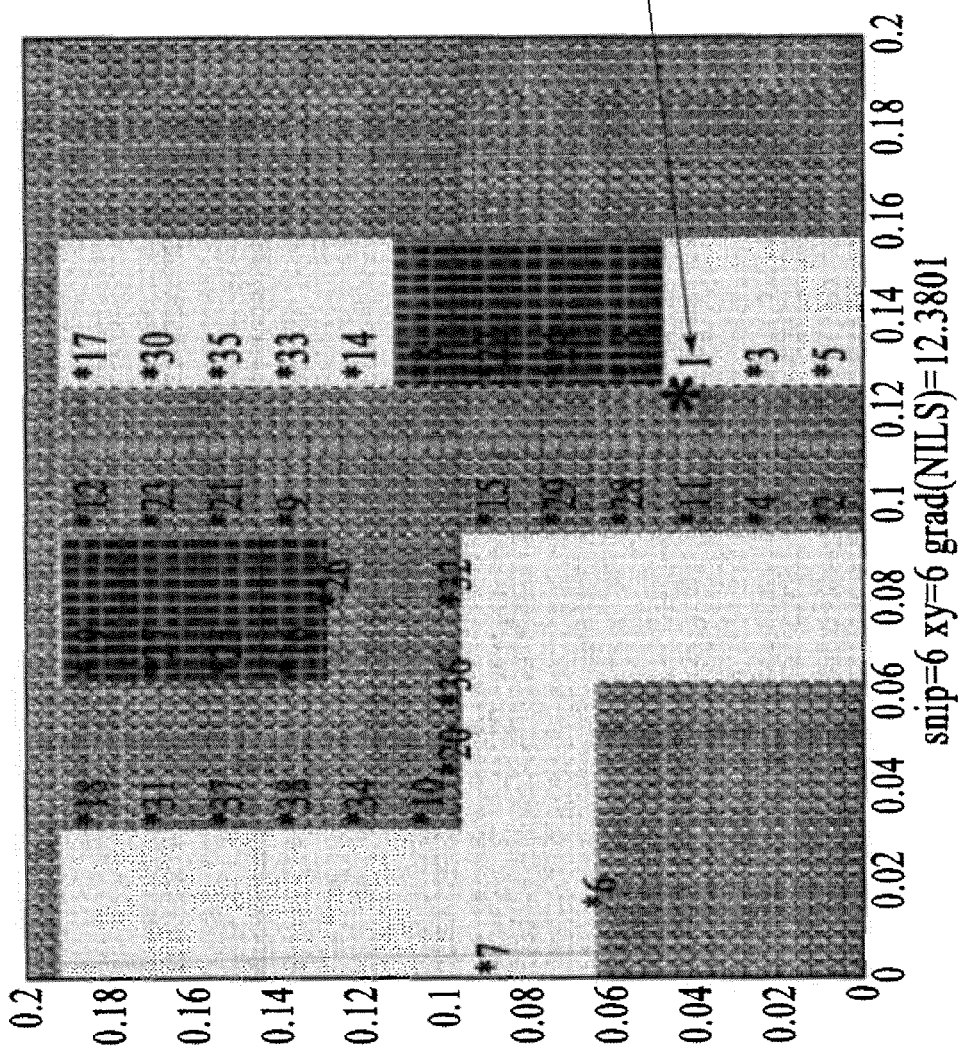
Figure 16:
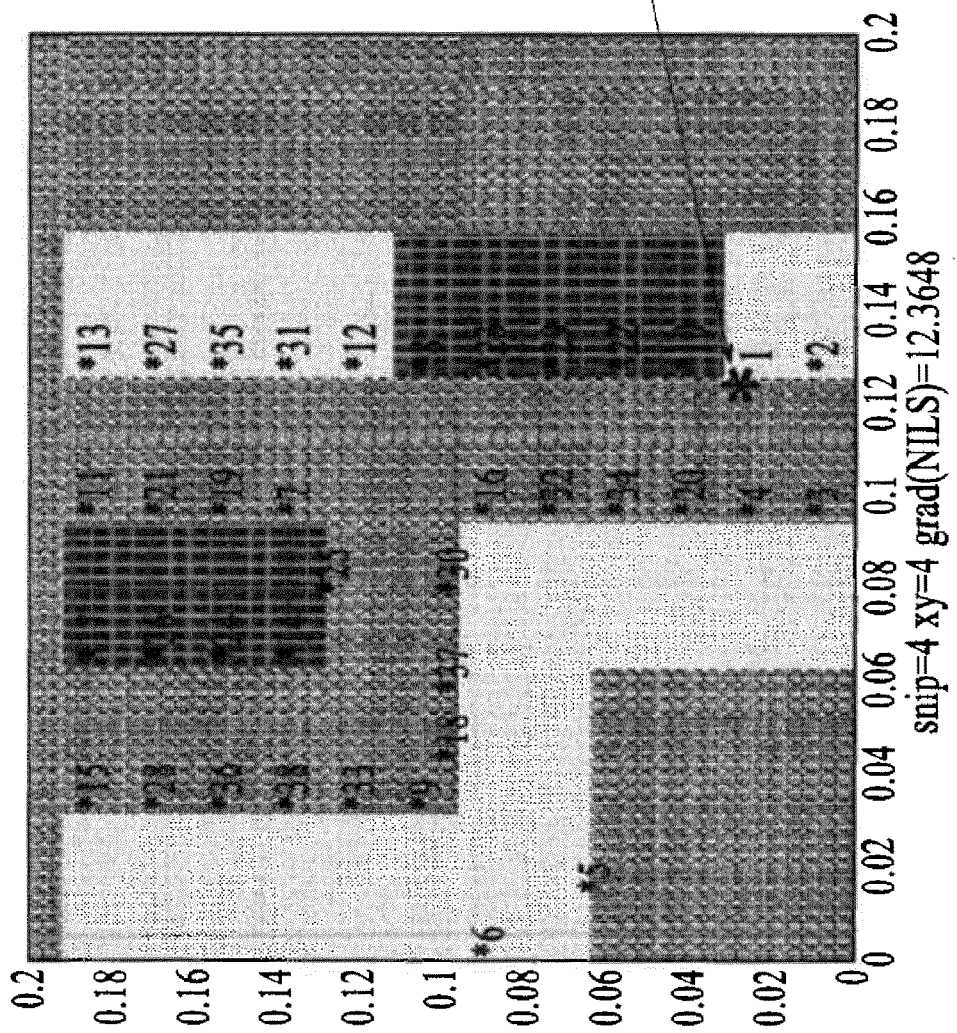
Figure 17:
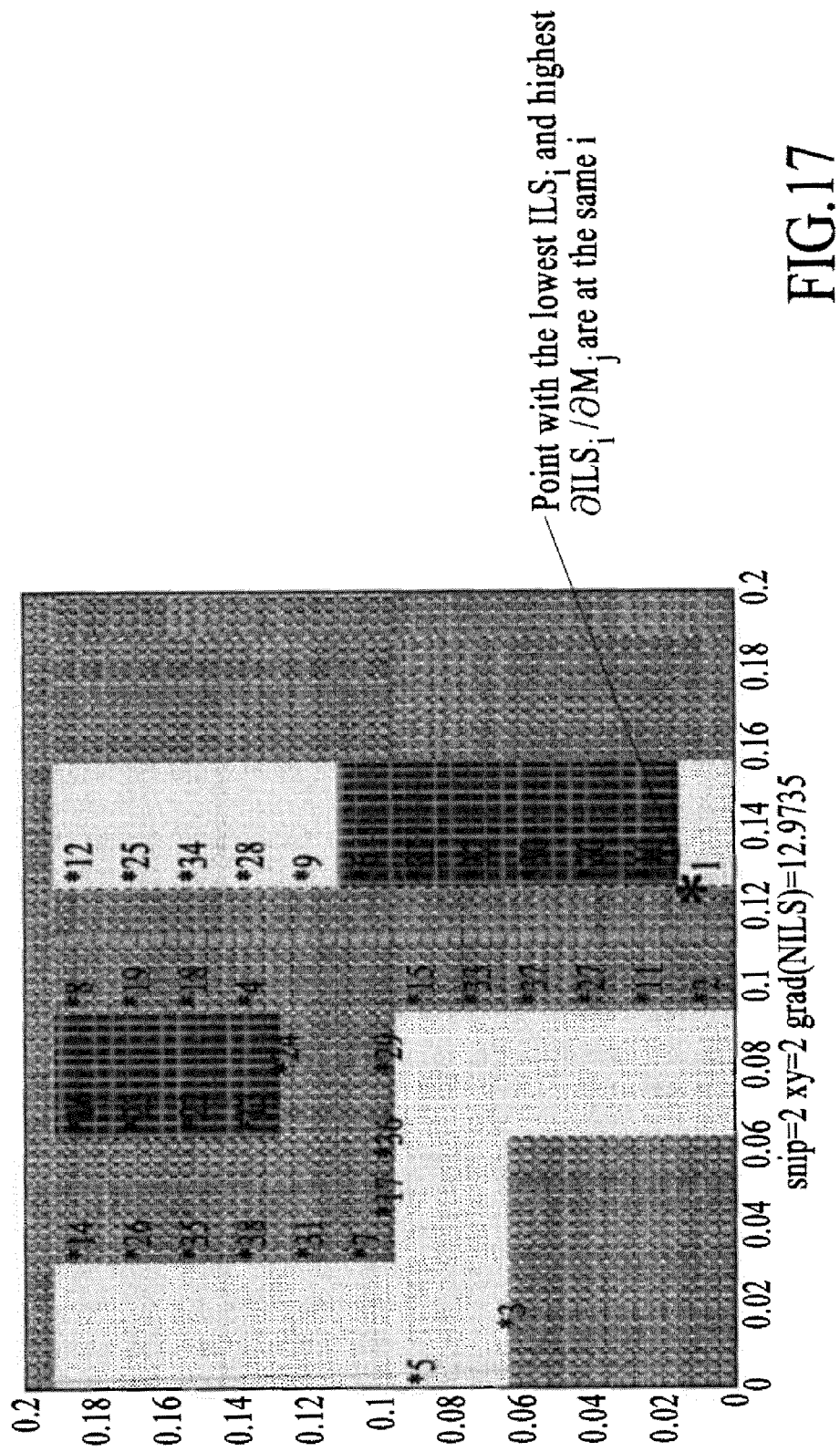
Figure 18:
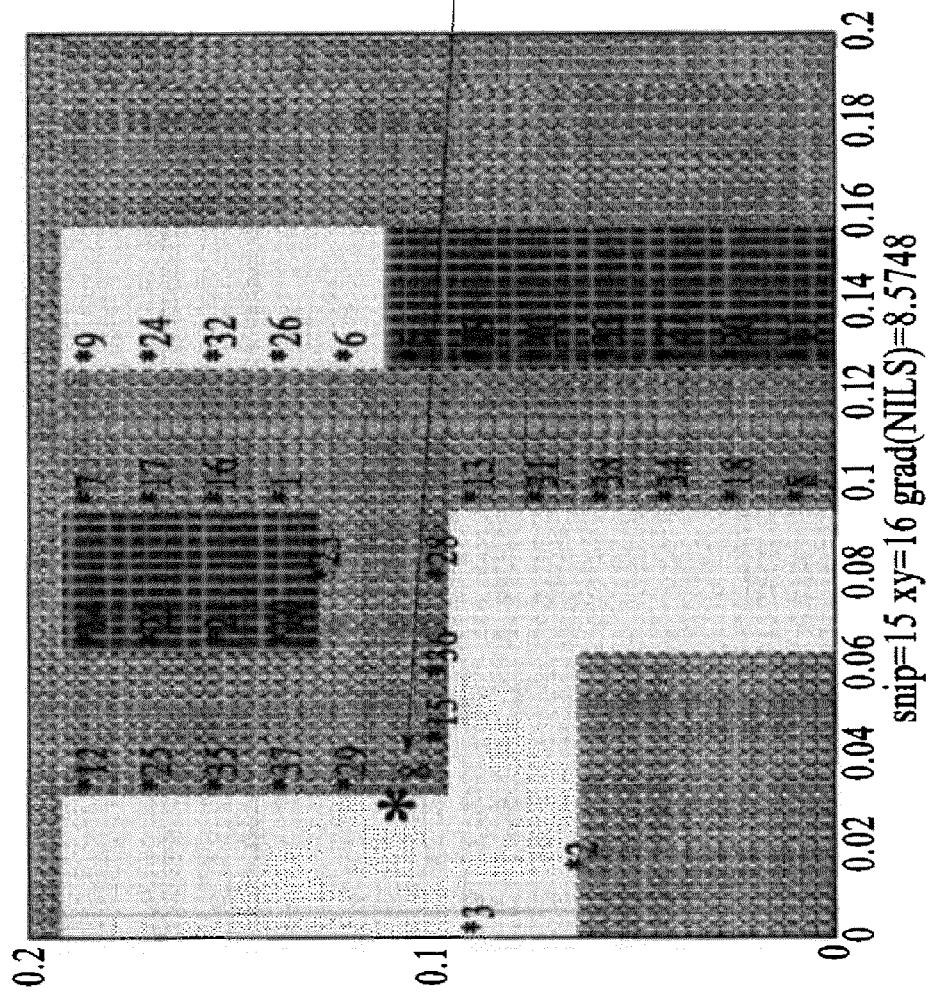
Figure 19:
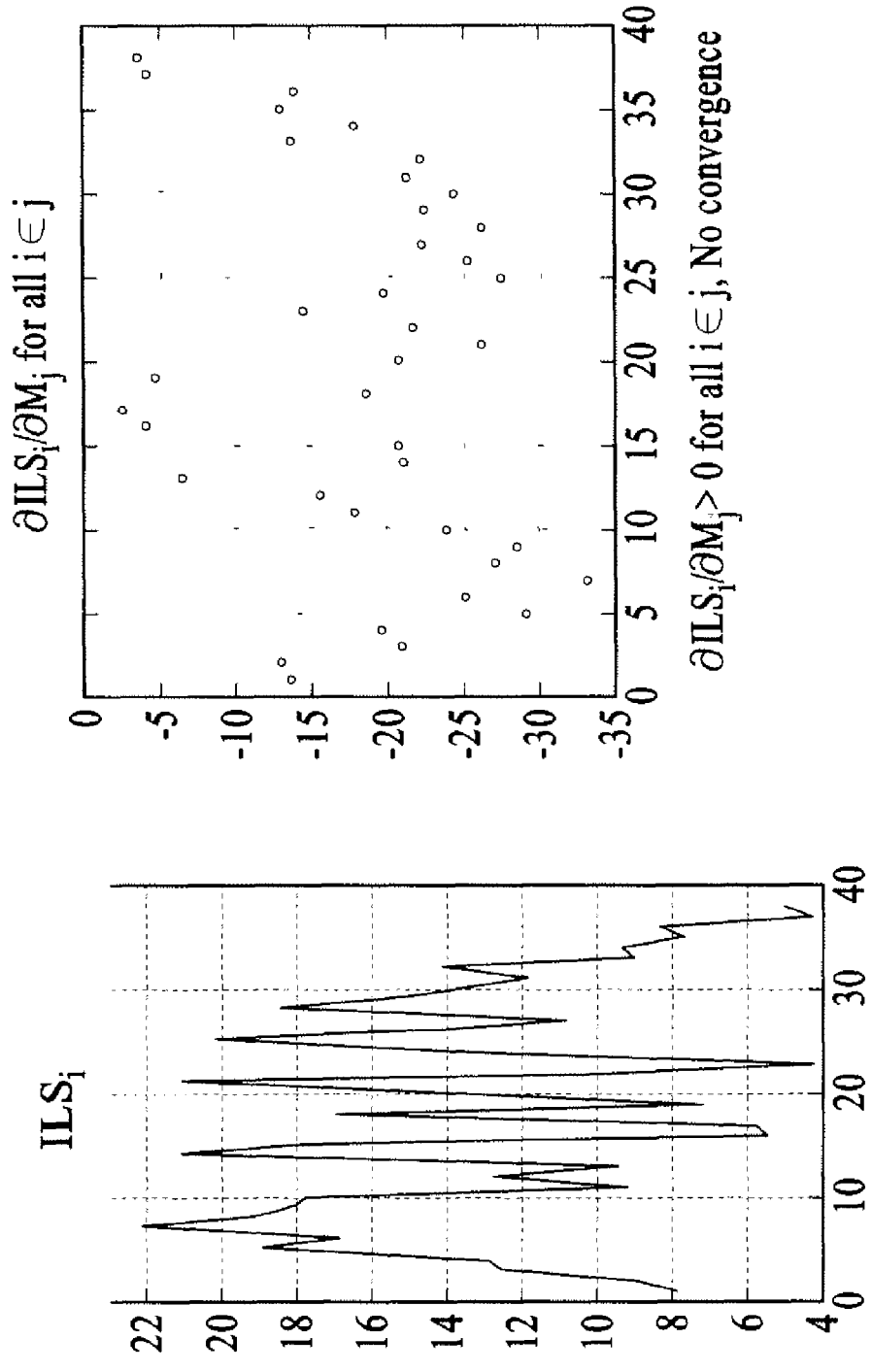

FIGS. 12 and 13 illustrate the fifth iteration of the process for the given example. It is noted that segments M16 and M18 are shown flipped in color in FIG. 12, which was the result of the fourth iteration of the process. In the given example, segment M13 is the segment having the highest gradient value, $\partial ILSi/\partial Mj$, but a different segment, M3, has the lowest ILS value. As a result, the process proceeds to Step 575 and the color of the segment M13 associated with the selected evaluation point is flipped, and a check for convergence is performed. In the given example, there is no convergence. After completing Step 575, the process proceeds back to Step 550 and selects the next evaluation point.

Figure 20:
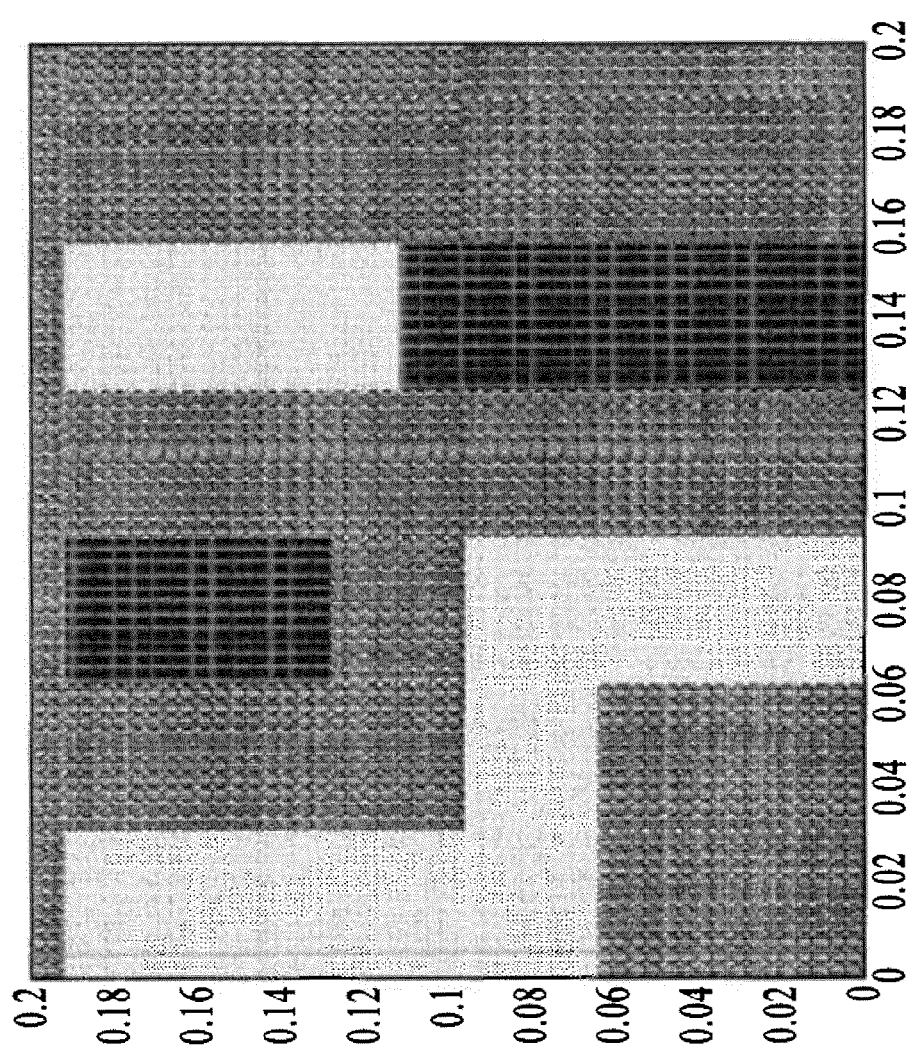

FIGS. 14-19 illustrate the result of the sixth through tenth iteration of the process for the given example. FIG. 20 illustrates the final result of the process in which it is shown that features 220 and 230 are assigned to two different masks, while feature 240 is split such that a top portion of the feature is assigned to the same mask as feature 220, while a bottom portion of the feature is assigned to the same mask as feature 230.

Variations of the foregoing process are also possible. For example, it is possible to divide/assign the polygons/features into more than two categories and utilize more than two exposures to image the resulting mask layout. It is also noted that the techniques of the present invention can be utilized with either dark field masks or clear field masks. The techniques of the present invention can also be utilized as a model-based coloring algorithm for alternating phase-shift masks. Further, it is also noted that the techniques of the present invention can be utilized in conjunction with ASML's previously disclosed illumination optimization techniques or ASML's illumination and source optimization techniques.

As noted above, the present invention provides important advantages over the prior art. Most importantly, the present invention provides a model based coloring process for decomposing the features of a target pattern into distinct segments which can be imaged separately, for example, by utilizing multiple masks. In addition, the model based coloring process of the present invention allows for a single feature of the target pattern to be automatically separated/divided into multiple segments which can be also be imaged separately.

Figure 21:
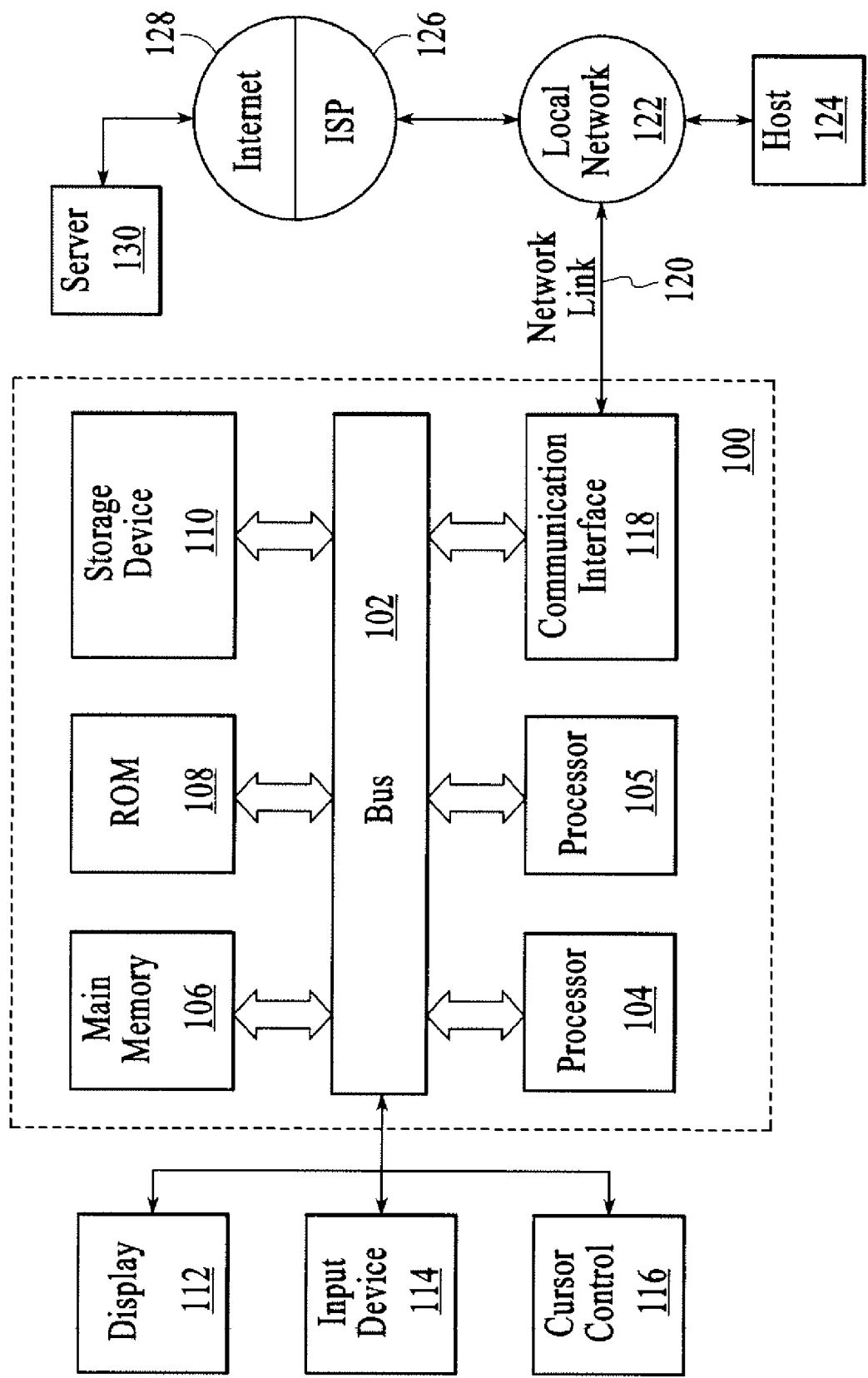
FIG. 21 is a block diagram that illustrates a computer system which can implement illumination optimization according to an embodiment of the present invention.

FIG. 21 is a block diagram that illustrates a computer system 100 which can implement the coloring process explained above. Computer system 100 includes a bus 102 or other communication mechanism for communicating information, and a processor 104 coupled with bus 102 for processing information. Computer system 100 also includes a main memory 106, such as a random access memory (RAM) or other dynamic storage device, coupled to bus 102 for storing information and instructions to be executed by processor 104. Main memory 106 also may be used for storing temporary variables or other intermediate information during execution of instructions to be executed by processor 104. Computer system 100 further includes a read only memory (ROM) 108 or other static storage device coupled to bus 102 for storing static information and instructions for processor 104. A storage device 110, such as a magnetic disk or optical disk, is provided and coupled to bus 102 for storing information and instructions.

Computer system 100 may be coupled via bus 102 to a display 112, such as a cathode ray tube (CRT) or flat panel or touch panel display for displaying information to a computer user. An input device 114, including alphanumeric and other keys, is coupled to bus 102 for communicating information and command selections to processor 104. Another type of user input device is cursor control 116, such as a mouse, a trackball, or cursor direction keys for communicating direction information and command selections to processor 104 and for controlling cursor movement on display 112. This input device typically has two degrees of freedom in two axes, a first axis (e.g., x) and a second axis (e.g., y), that allows the device to specify positions in a plane. A touch panel (screen) display may also be used as an input device.

According to one embodiment of the invention, the coloring process may be performed by computer system 100 in response to processor 104 executing one or more sequences of one or more instructions contained in main memory 106. Such instructions may be read into main memory 106 from another computer-readable medium, such as storage device 110. Execution of the sequences of instructions contained in main memory 106 causes processor 104 to perform the process steps described herein. One or more processors in a multi-processing arrangement may also be employed to execute the sequences of instructions contained in main memory 106. In alternative embodiments, hard-wired circuitry may be used in place of or in combination with software instructions to implement the invention. Thus, embodiments of the invention are not limited to any specific combination of hardware circuitry and software.

The term "computer-readable medium" as used herein refers to any medium that participates in providing instructions to processor 104 for execution. Such a medium may take many forms, including but not limited to, non-volatile media, volatile media, and transmission media. Non-volatile media include, for example, optical or magnetic disks, such as storage device 110. Volatile media include dynamic memory, such as main memory 106. Transmission media include coaxial cables, copper wire and fiber optics, including the wires that comprise bus 102. Transmission media can also take the form of acoustic or light waves, such as those generated during radio frequency (RF) and infrared (IR) data communications Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge, a carrier wave as described hereinafter, or any other medium from which a computer can read.

Various forms of computer readable media may be involved in carrying one or more sequences of one or more instructions to processor 104 for execution. For example, the instructions may initially be borne on a magnetic disk of a remote computer. The remote computer can load the instructions into its dynamic memory and send the instructions over a telephone line using a modem. A modem local to computer system 100 can receive the data on the telephone line and use an infrared transmitter to convert the data to an infrared signal. An infrared detector coupled to bus 102 can receive the data carried in the infrared signal and place the data on bus 102. Bus 102 carries the data to main memory 106, from which processor 104 retrieves and executes the instructions.

The instructions received by main memory 106 may optionally be stored on storage device 110 either before or after execution by processor 104.

Computer system 100 also preferably includes a communication interface 118 coupled to bus 102. Communication interface 118 provides a two-way data communication coupling to a network link 120 that is connected to a local network 122. For example, communication interface 118 may be an integrated services digital network (ISDN) card or a modem to provide a data communication connection to a corresponding type of telephone line. As another example, communication interface 118 may be a local area network (WAN) card to provide a data communication connection to a compatible LAN. Wireless links may also be implemented. In any such implementation, communication interface 118 sends and receives electrical, electromagnetic or optical signals that carry digital data streams representing various types of information.

Network link 120 typically provides data communication through one or more networks to other data devices. For example, network link 120 may provide a connection through local network 122 to a host computer 124 or to data equipment operated by an Internet Service Provider (ISP) 126. ISP 126 in turn provides data communication services through the worldwide packet data communication network, now commonly referred to as the "Internet" 128. Local network 122 and Internet 128 both use electrical, electromagnetic or optical signals that carry digital data streams. The signals through the various networks and the signals on network link 120 and through communication interface 118, which carry the digital data to and from computer system 100, are exemplary forms of carrier waves transporting the information.

Computer system 100 can send messages and receive data, including program code, through the network(s), network link 120, and communication interface 118. In the Internet example, a server 130 might transmit a requested code for an application program through Internet 128, ISP 126, local network 122 and communication interface 118. In accordance with the invention, one such downloaded application provides for the illumination optimization of the embodiment, for example. The received code may be executed by processor 104 as it is received, and/or stored in storage device 110, or other non-volatile storage for later execution. In this manner, computer system 100 may obtain application code in the form of a carrier wave.

Figure 22:
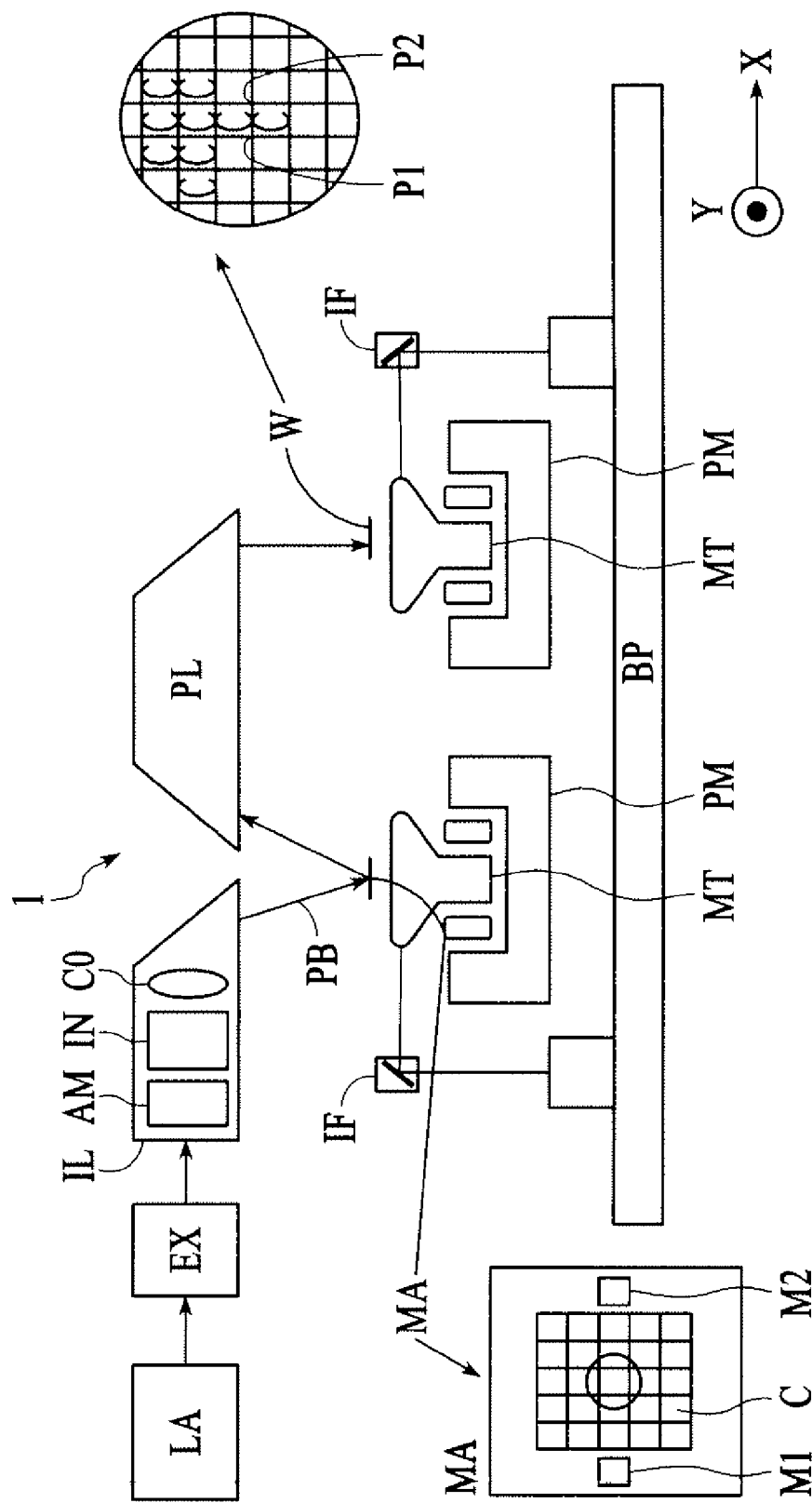
FIG. 22 schematically depicts an exemplary lithographic projection apparatus suitable for use with a mask designed with the aid of the disclosed concepts.

FIG. 22 schematically depicts a lithographic projection apparatus suitable for use with masks designed with the aid of the current invention. The apparatus comprises:

a radiation system Ex, IL, for supplying a projection beam PB of radiation. In this particular case, the radiation system also comprises a radiation source LA;

a first object table (mask table) MT provided with a mask holder for holding a mask MA (e.g., a reticle), and connected to first positioning means for accurately positioning the mask with respect to item PL;

a second object table (substrate table) WT provided with a substrate holder for holding a substrate W (e.g. a resist-coated silicon wafer), and connected to second positioning means for accurately positioning the substrate with respect to item PL;

a projection system ("lens") PL (e.g., a refractive, catoptric or catadioptric optical system) for imaging an irradiated portion of the mask MA onto a target portion C (e.g., comprising one or more dies) of the substrate W.

As depicted herein, the apparatus is of a transmissive type (i.e., has a transmissive mask). However, in general, it may also be of a reflective type, for example (with a reflective mask). Alternatively, the apparatus may employ another kind of patterning means as an alternative to the use of a mask; examples include a programmable mirror array or LCD matrix.

The source LA (e.g., a mercury lamp or excimer laser) produces a beam of radiation. This beam is fed into an illumination system (illuminator) IL, either directly or after having traversed conditioning means, such as a beam expander Ex, for example. The illuminator IL may comprise adjusting means AM for setting the outer and/or inner radial extent (commonly referred to as σ-outer and σ-inner, respectively) of the intensity distribution in the beam. In addition, it will generally comprise various other components, such as an integrator IN and a condenser CO. In this ways the beam PB impinging on the mask MA has a desired uniformity and intensity distribution in its cross-section.

It should be noted with regard to FIG. 22 that the source LA may be within the housing of the lithographic projection apparatus (as is often the case when the source LA is a mercury lamp, for example), but that it may also be remote from the lithographic projection apparatus, the radiation beam that it produces being led into the apparatus (e.g., with the aid of suitable directing mirrors); this latter scenario is often the case when the source LA is an excimer laser (e.g., based on KrF, ArF or $F_2$ lasing). The current invention encompasses both of these scenarios.

The beam PB subsequently intercepts the mask MA, which is held on a mask table MT. Having traversed the mask MA, the beam PB passes through the lens PL, which focuses the beam PB onto a target portion C of the substrate W. With the aid of the second positioning means (and interferometric measuring means IF), the substrate table WT can be moved accurately, e.g., so as to position different target portions C in the path of the beam PB. Similarly, the first positioning means can be used to accurately position the mask MA with respect to the path of the beam PB, e.g., after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 22. However, in the case of a wafer stepper (as opposed to a step-and-scan tool) the mask table MT may just be connected to a short-stroke actuator, or may be fixed.

The depicted tool can be used in two different modes:

In step mode, the mask table MT is kept essentially stationary, and an entire mask image is projected in one go (i.e., a single "flash") onto a target portion C. The substrate table WT is then shifted in the x and/or y directions so that a different target portion C can be irradiated by the beam PB;

In scan mode, essentially the same scenario applies, except that a given target portion C is not exposed in a single "flash". Instead, the mask table MT is movable in a given direction (the so-called "scan direction", e.g., the y direction) with a speed v, so that the projection beam PB is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

Although the present invention has been described and illustrated in detail, it is to be clearly understood that the same is by way of illustration and example only and is not to be taken by way of limitation, the scope of the present invention being limited only by the terms of the appended claims.

What is claimed is:

1. A method of decomposing a target pattern having features to be imaged on a substrate so as to allow said features to be imaged in a multi-exposure process, said method comprising the steps of:
    (a) dividing a plurality of said features into a plurality of segments;
    (b) determining the image log slope (ILS) value for each of said plurality of segments;
    (c) determining the value of the gradient of the image log slope (ILS) value for each of said plurality of segments; and
    (d) assigning a phase or color to said segments based on the values of the gradient of the image log slope of each of said plurality of segments.

2. A method according to claim 1, further comprising:
    (e) placing one or more evaluation points on the plurality of segments,
    wherein (b) determining the ILS value for the plurality of segments is performed at the one or more evaluation points.

3. A method according to claim 2, wherein (e) placing the evaluation points includes placing the evaluation points at edges of the plurality of segments.

4. A method according to claim 2, wherein (e) placing the evaluation points includes placing exactly one evaluation point on each of the plurality of segments.

5. A method according to claim 1, wherein (a) dividing the plurality of features is performed so that each of the segments is substantially the same size.

6. A method according to claim 1, wherein (a) dividing the plurality of features includes, for a given feature, projecting a ray from a vertex within the given feature to another point within the feature.

7. A method according to claim 6, wherein the ray has a length substantially equal to a minimum resolvable space for an exposure in the multi-exposure process.

8. A method according to claim 1, wherein (a) dividing the plurality of features includes pixelizing the features, wherein each pixel comprises a segment.

9. A method according to claim 8, wherein the size of each pixel corresponds to a resolution of a mask writer used for the multi-exposure process.

10. A method according to claim 1, further comprising (e) ordering one or both of the determined ILS values and gradient values from highest to lowest.

11. A method comprising:
    identifying a target pattern for a multi-exposure process;
    segmenting the target pattern into a plurality of segments;
    calculating a model-based image value for each of the plurality of segments; and
    assigning the segments to respective exposures in the multi-exposure process using the calculated model-based image value.

12. A method according to claim 11, further comprising identifying illumination settings for the multi-exposure process, wherein calculating the model-based image value is performed using the identified illumination settings.

13. A method according to claim 11, further comprising:
    placing one or more evaluation points on the plurality of segments,
    wherein calculating the model-based image value for the plurality of segments is performed at the one or more evaluation points.

14. A method according to claim 13, wherein placing the evaluation points includes placing the evaluation points at edges of the plurality of segments.

15. A method according to claim 13, wherein placing the evaluation points includes placing exactly one evaluation point on each of the plurality of segments.

16. A method according to claim 11, wherein segmenting the target pattern is performed so that each of the segments is substantially the same size.

17. A method according to claim 11, wherein segmenting the target pattern includes pixelizing the target pattern, wherein each pixel comprises a segment.

18. A method according to claim 17, wherein the size of each pixel corresponds to a resolution of a mask writer used for the multi-exposure process.

19. A method according to claim 11, wherein assigning the segments includes performing an iterative process including:
    selecting one of the segments based on the calculated model-based image value;
    assigning the segment to an exposure;
    performing further calculations based on the assignment; and
    re-assigning or keeping the assignment based on the further calculations.

20. A non-transitory computer readable storage medium comprising instructions, which when executed by a computer, cause the computer to perform a method of decomposing a target pattern having features to be imaged on a substrate so as to allow said features to be imaged in a multi-exposure process, said method comprising the steps of:
    (a) dividing a plurality of said features into a plurality of segments;
    (b) determining the image log slope (ILS) value for each of said plurality of segments;
    (c) determining the value of the gradient of the image log slope (ILS) value for each of said plurality of segments; and
    (d) assigning a phase or color to said segments based on the values of the gradient of the image log slope of each of said plurality of segments.

* * * * *